(12) United States Patent
Farah

(10) Patent No.: US 10,644,188 B2
(45) Date of Patent: *May 5, 2020

(54) LASER EPITAXIAL LIFT-OFF GAAS SUBSTRATE

(71) Applicant: John Farah, Attleboro, MA (US)

(72) Inventor: John Farah, Attleboro, MA (US)

(*) Notice: Subject to any disclaimer, the term of this patent is extended or adjusted under 35 U.S.C. 154(b) by 205 days.

This patent is subject to a terminal disclaimer.

(21) Appl. No.: 15/817,106

(22) Filed: Nov. 17, 2017

(65) Prior Publication Data

US 2018/0248070 A1 Aug. 30, 2018

Related U.S. Application Data

(63) Continuation-in-part of application No. 14/309,812, filed on Jun. 19, 2014, now Pat. No. 9,831,363.

(60) Provisional application No. 61/836,255, filed on Jun. 18, 2013.

(51) Int. Cl.
| | |
|---|---|
| *H01L 31/18* | (2006.01) |
| *H01L 21/78* | (2006.01) |
| *H01L 31/0304* | (2006.01) |
| *H01L 31/0687* | (2012.01) |
| *H01L 33/00* | (2010.01) |

(52) U.S. Cl.
CPC ...... *H01L 31/1844* (2013.01); *H01L 21/7813* (2013.01); *H01L 31/03046* (2013.01); *H01L 31/06875* (2013.01); *H01L 31/1896* (2013.01); *H01L 33/0079* (2013.01); *Y02E 10/544* (2013.01)

(58) Field of Classification Search
USPC .......................... 257/78, 65; 117/90, 94, 915
See application file for complete search history.

(56) References Cited

U.S. PATENT DOCUMENTS

| | | | |
|---|---|---|---|
| 10,347,657 B1* | 7/2019 | Leobandung | ....... H01L 27/1207 |
| 2013/0213469 A1* | 8/2013 | Kramer | .......... H01L 31/022458 |
| | | | 136/256 |
| 2013/0228221 A1* | 9/2013 | Moslehi | .......... H01L 31/022441 |
| | | | 136/256 |
| 2013/0270655 A1* | 10/2013 | Adam | ............... H01L 29/66545 |
| | | | 257/410 |
| 2014/0217502 A1* | 8/2014 | Chang | ............... H01L 29/66477 |
| | | | 257/347 |
| 2016/0254407 A1* | 9/2016 | Wang | .............. H01L 31/035281 |
| | | | 136/256 |

(Continued)

*Primary Examiner* — Nina Bhat

(57) ABSTRACT

An epitaxially grown III-V layer is separated from the growth substrate. The III-V layer can be an inverted lattice matched (ILM) or inverted metamorphic (IMM) solar cell, or a light emitting diode (LED). A sacrificial epitaxial layer is embedded between the GaAs wafer and the III-V layer. The sacrificial layer is damaged by absorbing IR laser radiation. A Nd:YAG laser is chosen with the right wavelength, pulse width and power. The radiation is not absorbed by either the GaAs wafer or the III-V layer. No expensive ion implantation or lateral chemical etching of a sacrificial layer is needed. The III-V layer is detached from the growth wafer by propagating a crack through the damaged layer. The active layer is transferred wafer-scale to inexpensive, flexible, organic substrate. The process allows re-using of the wafer to grow new III-V layers, resulting in savings in raw materials and grinding and etching costs.

12 Claims, 24 Drawing Sheets

(56) References Cited

U.S. PATENT DOCUMENTS

2017/0236954 A1* 8/2017 Kramer ............ H01L 31/02167
                                                                136/256

* cited by examiner

Inverted metamorphic triple junction solar cell (IMM)

* not drawn to scale

PRIOR ART

PRIOR ART

PRIOR ART
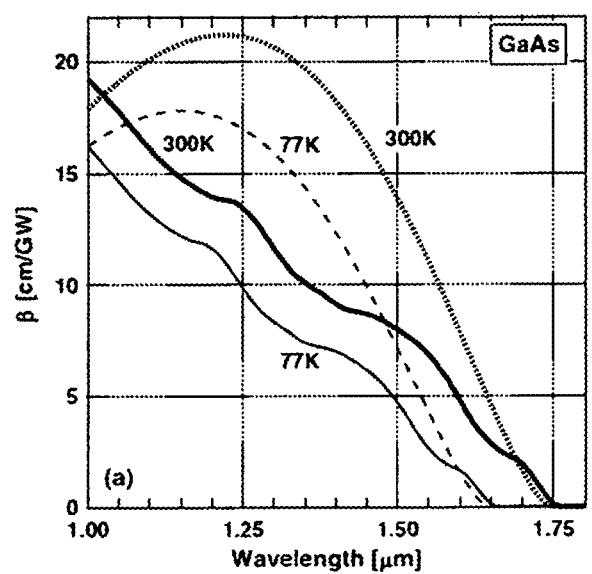
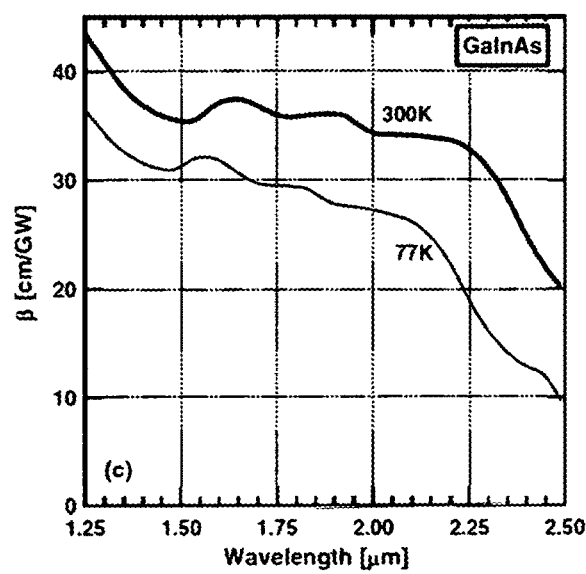
Fig. 16A
Fig. 16B

PRIOR ART

PRIOR ART
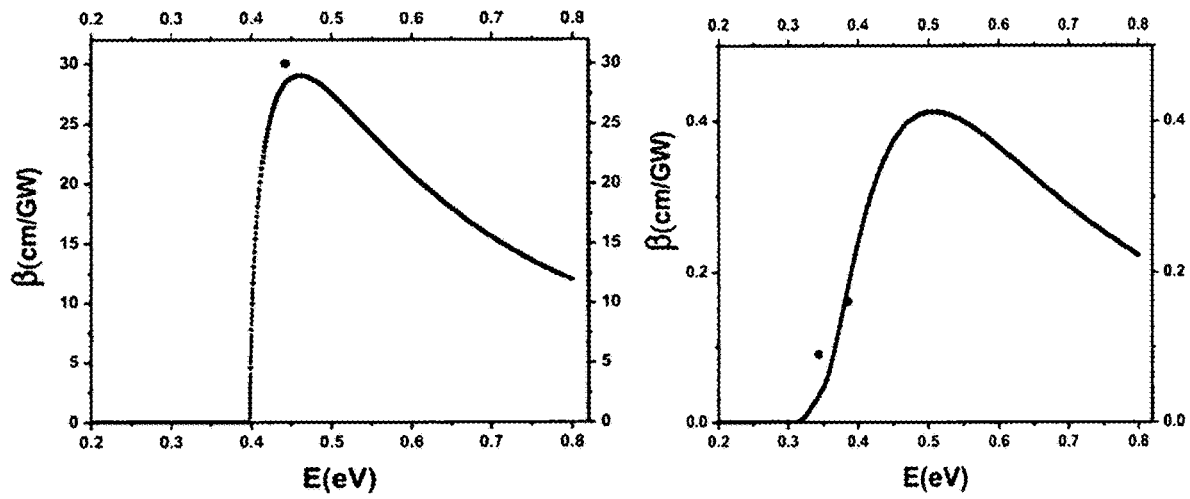
Fig. 18A
Fig. 18B
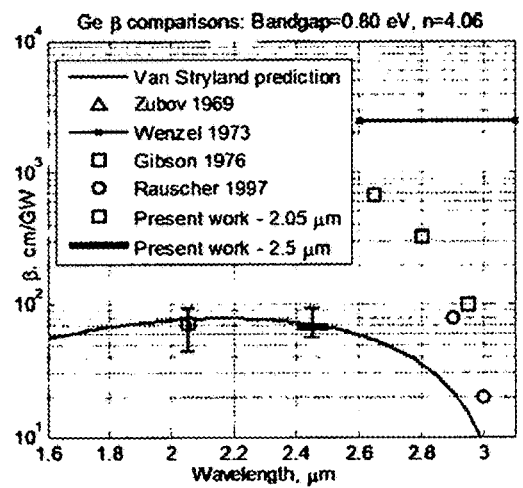
Fig. 18C

PRIOR ART

PRIOR ART

Ablation depth as a function of the laser fluences $F$ for single pulse ($\tau = 150$ fs, $\lambda = 800$ nm) of single crystal germanium in air.

LASER EPITAXIAL LIFT-OFF GAAS SUBSTRATE

RELATED APPLICATIONS

This application claims priority under 35 U.S.C. § 119(e) to non-provisional U.S. application Ser. No. 14/309,812 entitled "Laser Epitaxial Lift-Off of High Efficiency Solar Cell" filed on Jun. 19, 2014, which claims priority to provisional Application Ser. No. 61/836,255 filed on Jun. 18, 2013, which are herein incorporated by reference in their entirety.

BACKGROUND OF THE INVENTION

Field of the Invention

This invention applies to epitaxially grown light-emitting diodes (LED's) and solar cells and specifically to inverted solar cell structures. LED's are grown on GaAs substrates. Also inverted metamorphic (IMM) III-V multi junction solar cells are grown epitaxially on GaAs wafers that are up to 700 µm thick. These cells achieve the highest efficiencies (>30% in space and >40% terrestrial under concentrator). The solar photons are absorbed in the epitaxial layer, which is about 10 µm thick. The substrate is only for mechanical support and considered wasted from a materials point of view. It is desired to lift-off the epi-layer and transfer to flexible polyimide substrate and to reuse the GaAs wafer to grow another epi-layer multiple times. The cost of materials to produce a GaAs wafer suitable for a solar cell is about $50 per Watt. This accounts for about 40% of the cost of the finished cell. There is a need to make high efficiency solar cells thin, lightweight and flexible to achieve high specific power (>200 W/Kg); and foldable so that they can be stowed in a small volume to increase payload space. A new cost-effective dry lift-off process which transfers the active cell layer wafer-scale to a less expensive flexible substrate without ion implantation or chemical etching is presented. This yields thin high efficiency solar cells which have the same performance on the host substrate as on the growth substrate and which are easily scalable to large size arrays. This process allows re-using of the base semiconductor wafer to grow new cells which results in savings in GaAs materials, lapping and etching expenses. This technology reduces the cost of the cell by 30% and allows a very rapid growth of the terrestrial market for high efficiency III-V solar cells.

The savings are not only monetary. This has huge implications on natural resources. Gallium is the rarest component of the photovoltaic compounds. All the newly developed solar cell materials, such as CIGS, contain Gallium. As the substrate is currently ground or etched away for the epitaxial lift-off, a substantial percentage of the world's current Ga production from mining goes to waste. This creates one of the most expensive toxic wastes because GaAs contains arsenic, which is toxic. Thus, cost is not the only issue but also availability of the material. Therefore, this technology solves the bottleneck in the Ga supply chain and will have broad impact on society and the ecology.

The base wafer accounts for 40% of the cost of a finished cell. Thus, reducing the materials used in solar cells will go a long way toward reducing the overall cost of the cell. This can be achieved by transferring the epi-layer to a cheaper substrate and reusing the wafer to grow another epi-layer. This would achieve the lowest cost, while preserving rare earth materials.

Discussion of Related Art

Wet epitaxial lift-off (WELO) has been demonstrated by incorporating a lattice-matched sacrificial release layer, such as $Al_{0.7}Ga_{0.3}As$, under the epi-layer, which gets etched off chemically in HCl or HF. It takes up to several hours to free a GaAs layer from its growth substrate due to the restricted access of the etchant to the AlGaAs layer, especially for large size wafers. This is considered too slow for industrial utilization. It should take only seconds per wafer to be viable for large scale manufacturing. Therefore, a technique for quicker peel-off that would have wider industrial application is needed.

There were several recent attempts in the industry to slice a wafer from ingot kerflessly using a technique called "spalling". A thick metallic stressor layer, usually Ni, is deposited on the semiconductor wafer and heated at very high temperature >800° C. The stress caused by the difference in the coefficients of thermal expansion (CTE) between metal and semiconductor as the wafer cools to room temperature exceeds the fracture toughness of the material and causes a crack to propagate in the substrate parallel to the surface at a certain depth below the interface. This causes a thin layer to separate from the base substrate and remain stuck to the metal film. A high peak temperature is necessary to cause the stresses. This enhances the diffusion of impurities from the metal into the silicon which act as recombination centers for electron-hole pairs and lower the efficiency. Further, the high temperature affects the morphology of the crystal. The crack propagates uncontrollably. As a result, the depth at which the cleavage occurs cannot be controlled precisely and the surface is rough. The metal layer is dissolved which yields a 25 µm free standing silicon foil. A solar cell is subsequently fabricated in the silicon foil. Foils up to 150 $cm^2$ area have been fabricated. The extracted foil is not supported and is therefore brittle and prone to chipping. Nevertheless, single junction solar cells fabricated in the foil exhibited similar performance to identical cells on bulk substrates which indicates that the quality of the crystal is not compromised by the lift-off.

The (110) is the preferred cleavage plane in GaAs. However, solar cell manufacturers are reluctant to grow on (110) wafers because most of the industry is built on (100) wafers, albeit with large off-cut angles up to 15° toward the (111)A plane.

The ultimate goal of all lift-off techniques is to re-use the base wafer after lift-off.

Laser micromachining inside the bulk of materials is used for making waveguides inside transparent materials (glass), and has been proposed as a way for wafering silicon from ingot. These techniques depend on non-linear absorption at the focal point, forming a sub-surface defect while leaving the region between the surface and the defect untouched. Light from an IR laser at a wavelength above 1 µm is focused below the surface and scanned across the wafer. The size of the defect depends on the depth of focus. This requires the use of large diffraction limited lenses with short focal lens and low f # and necessitates the use of high precision and resolution vertical positioning stages, which are expensive. Silicon does not benefit from heterogeneous epitaxial growth where separation of the epi-layer from the wafer can be done using a sacrificial layer at the interface, and therefore, wafering in silicon relies more on the quality and precision of the optics rather than the physics of absorption.

Laser ablation is used for epitaxial lift-off of GaN layers from sapphire substrates for the fabrication of LEDs.

SUMMARY OF THE INVENTION

It is desired to cleave at or very near the epi/wafer interface without sacrificing substrate material. That would be true epitaxial lift-off so that the original wafer is recovered at full thickness. III-V materials have the advantage that devices are fabricated in epitaxially-grown layers. Thus, the epi-layer can be peeled off the substrate and transferred to another carrier, such as flexible substrate and the GaAs substrate can be reused to grow another epi-layer. The fragile crystalline solar cell must be supported at all times. A suitable flexible carrier is polyimide Kapton® sheet which is backed by DuPont and qualified for space applications. Kapton is available in sheets as thin as 50 μm which are easy to handle and come pre-coated with a uniform layer of acrylic adhesive, known as Pyralux®. It operates continuously from cryogenic to >200° C. which is suitable for space applications. A Kapton sheet with adhesive layer is bonded to the epi-side of GaAs wafer using a hot roll laminator and then cured in an oven at 150° C.-190° C. for about an hour. After lift-off the thin epi-layer is carried by the Kapton sheet which serves as permanent carrier of the IMM solar cell. The entire thickness of the thin solar cell is less than 100 μm, which meets the specific power requirements for space.

FIG. 1 shows a thin triple junction (IMM3J) epi-layer carried by polyimide substrate which was obtained by etching away the GaAs wafer. It shows a smooth shiny surface of the InGaP etch stop layer. This can be obtained by lifting-off the epi-layer without sacrificing the growth wafer so that it can be re-used to grow another epi-layer. This solar cell was rolled mechanically to a radius <½" and shocked thermally without fracturing.

The epi-layer can be separated from the growth substrate kerflessly either by 1) driving a crack at the interface due to thermal stresses, or 2) disintegrating a sacrificial layer by laser ablation, or 3) a combination of 1) and 2). These two approaches involve different physics but lead to the same end result. Both are dry, meaning they are fast and there is no wet lateral etching. These two concepts are illustrated schematically in FIG. 2A and FIG. 2B, respectively.

Dry Epitaxial Lift-Off (DELO)

The polyimide serves not only as the permanent carrier of the thin crystalline solar cell but also as the stressor layer which creates the thermal stresses that lead to cleavage. Kapton has a CTE of 16-20 ppm/° C. compared to 5-6 ppm/° C. for GaAs. The temperature is lowered by introducing the composite structure slowly in liquid nitrogen at −196° C. Within a minute, an audible crack initiates and the film snaps right off. The temperature differential $\Delta T \sim 300°$ C. (between the curing temperature and $LN_2$) and the CTE difference $\Delta\alpha$ of 10-14 ppm/° C. yield a driving thermal strain of $\Delta\alpha\Delta T \sim 3\times 10^{-3}$. This is sufficient to initiate and propagate a crack across the wafer. Crack nucleation is due solely to the build-up of thermal stresses without application of external mechanical force. When the stress intensity factor $K_I$ exceeds the fracture toughness of the material $K_{Ic}$ the crack starts to propagate. The energy release rate due to the polyimide loading remains constant as the crack propagates. Thus, a man-made defect, such as a scratch is not needed. The crack will start from an inherent defect in the material at the point where $K_I = K_{Ic}$. As long as the energy release rate G is larger than $2\gamma$, where $\gamma$ is the surface energy of the material, which is a material property, it will overcome the resistance to crack propagation.

The crack propagates beneath the surface at a depth which is prescribed by the thickness of the polyimide/GaAs wafer ratio. A polyimide thickness between 50 and 100 μm is able to lift a GaAs layer thickness between 10 and 20 μm off an original wafer thickness of about 380 μm. At this thickness the polyimide packs just enough elastic strain energy to initiate and propagate the crack across the wafer. In fact most of the strain energy is stored in the polyimide itself. A crack nucleates with an audible sound at a temperature about −140° C. as the wafer is lowered in the Dewar even before it touches the liquid. For GaAs the lift-off temperature is about −140° C. whereas for Si the wafer must be cooled down to −196° C. The crack propagates across the wafer in a fraction of a second. The wafer cleaves spontaneously at a plane parallel to the bond interface. Two wafers ensue: the base wafer in one piece, and the epi-layer on the polyimide. There are no cracks in the epi-layer on the polyimide. The front side of the solar cell can be processed on the Kapton after lift-off. The concept applies to all semiconductor materials, Si, Ge, GaAs and InP, SiC, GaN, AlN and to all epitaxially grown LED's and solar cells for space as well as terrestrial applications.

Kapton® tape which is commercially available and comes pre-coated with a thin adhesive layer, known as Pyralux® is perfect for this application and is even qualified for space. This is very convenient because it is not easy to apply an adhesive layer uniformly over an entire 4" wafer. The adhesive layer must be uniform in order to carry a fragile epi-layer 10-100 μm thick without fracturing it. Kapton is available in layers as thin as 25 μm in 25 μm increments. Multiple layers can be laminated sequentially to obtain any desired thickness. The polyimide is very advantageous because it is able to induce lift-off for a temperature drop $\Delta T$ of only 300° C. compared to metal which requires raising to >800° C. Furthermore, it is completely inert and does not contaminate the semiconductor layer. Cooling in $LN_2$ is advantageous because GaAs becomes even more brittle at −196° C. which lowers the energy to propagate the crack. This process is low temperature between +200° C. and −196° C. The combination of polyimide/adhesive is tough and can withstand these temperatures. The acrylic adhesive material has sufficient shear strength and holds its grip at cryogenic temperature and is able to transmit the force necessary to rupture the semiconductor wafer, even Silicon Carbide (SiC) which has relatively large fracture toughness and elastic modulus. The adhesive layer is applied uniformly to Kapton. It has a smooth surface and supports the epi-layer over the entire 4" wafer. It was not known previously that a commercial off-the-shelf polyimide tape could be bonded to a semiconductor wafer and causes it to cleave a thin layer 10-100 μm simply by dunking in $LN_2$.

The sequence of frames in FIG. 3 taken from http://www.youtube.com/watch?v=Bltj5ZUe9TI show the backside of a GaAs wafer piece bonded to Kapton 50 μm thick on the front side (underneath), on a plate as it is lowered slowly in a Dewar of liquid nitrogen. The successive pictures show the drop in temperature over the course of a few minutes until lift-off happened at a temperature of −140° C. As the lift-off temperature was reached the Kapton layer snapped off almost instantaneously. The curled peeled off epi-layer stuck to the Kapton sheet (brown) is shown in the right lower corner sitting on top of the GaAs wafer piece. The entire lift-off happens within a couple of minutes.

A lifted-off GaAs layer on Kapton can be held flat on a standard vacuum chuck. The following video http://www.youtube.com/watch?v=VC6v7_RAOok shows the lifted-off layer spinning at 3000 RPM which allows fabrication of the front side of the solar cell.

Cleavage by Crack Propagation Due to Thermal Stresses

The following is a summary of results obtained:
1) lifted-off a layer of GaAs 10-15 µm thick equivalent to IMM3J layer thickness,
2) cleaved 2" (110) and 4" (100) orientation wafers and saved the base wafer as one piece,
3) reused a base wafer and lifted-off another layer several times, there did not appear to be a limit to the number of reuses as long as the substrate remained thick enough,
4) obtained atomically smooth (mirror-like) surfaces (single atomic plane cleavage, roughness <0.1 nm) over areas (>1 cm$^2$) in (110) orientation wafer,
5) fabricated front side of solar cell on Kapton and demonstrated that the performance is not degraded compared to identical solar cell on GaAs wafer.

FIGS. 4 and 5 show the lifted-off layer on Kapton to the right and the base wafer to the left for GaAs (110) and Si (100), respectively. Uniform cleavage is obtained across 4" wafer. The (110) orientation yields smoother cleaved surface in GaAs. FIG. 6 shows AFM average roughness of 0.059 nm, below instrument noise, indicating that the cleavage is a single atomic plane.

Laser Epitaxial Lift-Off (LELO)

A sacrificial layer embedded between the GaAs wafer and the multi junction solar cell is damaged gently with a laser at the appropriate wavelength and fluence to break the atomic bonds at a certain plane without causing excessive heat or stresses to avoid damaging the substrate or the solar cell. The sacrificial layer must be single crystal and grown epitaxially. It is preferred to use a layer that is lattice-matched to the substrate in order to minimize the defects and avoid dislocations in the subsequently grown triple junction solar cell. It must have a bandgap lower than that of GaAs so that the laser radiation is not absorbed in the substrate.

BRIEF DESCRIPTION OF THE DRAWINGS

The accompanying drawings are not intended to be drawn to scale. In the drawings:

FIG. 16A Two-photon absorption coefficients at 300 K for GaAs;

FIG. 16B Two-photon absorption coefficients at 300 K for $In_{0.36}Ga_{0.64}As$;

FIG. 18A Two-photon absorption coefficients of Ge for direct transition;

FIG. 18B Two-photon absorption coefficients of Ge for indirect transition;

FIG. 18C Two-photon absorption coefficients of Ge for direct transition vs wavelength;

DETAILED DESCRIPTION OF THE INVENTION

Figure 1:
FIG. 1 Thin IMM3J solar cell on polyimide substrate 50 µm thick.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including", "comprising" or "having", "containing", "involving", "triple-junction" or "multi-junction" and variations thereof herein, is meant to encompass the items listed thereafter and equivalents thereof as well as additional items.

The focus of the instant invention is on the laser ablation of the SiGe sacrificial release layer concept illustrated in FIG. 2D.

Ge and GaAs are two well known semiconductor materials which have a peculiar relationship. They are almost lattice matched (Ge slightly larger) but Ge has an indirect bandgap (0.67 eV) well below that of GaAs (1.42 eV). Si is another well known semiconductor material which has a lattice constant smaller than both. They all share the same face centered cubic (FCC) diamond structure. The inclusion of 2% silicon in germanium pulls it slightly to the left and aligns it perfectly with GaAs. Therefore, the sacrificial layer is $Si_{0.02}Ge_{0.98}$. Ge is grown on GaAs by MOCVD. InGaAs is another potential material. The inclusion of Indium in GaAs increases the lattice unit dimension, with the result that the InGaAs layer will be strained. A pseudomorphic InGaAs layer up to 200 nanometers thick can be grown and may maintain its strain, but it would be difficult to grow high quality GaAs layers over such a layer. Furthermore, a strained layer this thin cannot absorb light effectively. By contrast a SiGe layer can be grown to any thickness because it is lattice-matched to the GaAs substrate. Further, unlike InGaAs, the etchant of Ge does not affect GaAs. Also, InGaAs has a bandgap and a melting point (1150° C.) higher than that of Ge (937° C.). Therefore, InGaAs presents no advantage over Ge as a sacrificial release layer.

Fabrication of inverted multi junction solar cells entails epitaxial growth of Ge layers on GaAs and GaAs layers on Ge. Similarly the fabrication of LED's, laser diodes and VCSELs entails successive growth of multiple layers on top of each other. GaAs is grown on Ge routinely, but the growth of Ge on GaAs is more delicate. The major concerns are the formation of anti-phase domains (APD) due to polarity mismatch, and the inter-diffusion among the layers at high temperature. The use of Ga or As pre-layers, migration enhanced epitaxy (MEE) growth, GaAs substrates with tilted orientations, and reduced growth temperatures have been shown to be effective at mitigating APD. Tilts up to 10° toward <111> plane are commonly used. The substrate is heated first to about 380° C. in vacuum, then about 20 successive monolayers of As and Ga are grown on Ge with 2 sec growth interruption between each As and Ga until 20 mono-layers of GaAs have been grown. Subsequently, the substrate temperature is raised to 420° C. and 520° C. to grow 200 nm GaAs buffer layer with both the Ga and As shutter open simultaneously. After that III-V solar cell structures can be grown under standard growth conditions (at a temperature of ~650° C.).

The embedded SiGe layer is ablated using a laser in the NIR. This exploits the difference in absorption coefficients between Ge and GaAs due to the fact that they have substantially different bandgaps. Therefore, the choice of wavelength is of paramount importance.

A laser with the right combination of energy and pulse duration is used to damage, i.e. photo-chemically break the bonds and weaken the SiGe layer so that the epi-layer can be separated from the wafer gently without causing excessive stress or bow, by pulling off the Kapton with either mechanical force or vacuum. This is true epitaxial lift-off because it guarantees that the separation is at the interface. True ELO should not depend on the wafer-to-polyimide thickness ratio or the orientation of the wafer. Any film can be transferred from any semiconductor wafer to another substrate, such as flexible substrate regardless of the thickness or orientation if a suitable wavelength is used that is not absorbed in the wafer but absorbed in the sacrificial layer. This relies on the physics of absorption rather than thermal stresses due to CTE mismatch. Nevertheless, the heat of ablation may cause a crack to propagate in the Ge layer. Most importantly, it relaxes the requirement on the optical focusing system. The lift-off can therefore be done using relatively inexpensive optical components and micro-positioning stages and mildly focused or even expanded laser beams. The embedded sacrificial layer does not even have to be within the focal zone.

Epitaxial growth of III-V compounds offers the possibility of separating the epi-layer from the growth wafer by embedding a lattice-matched sacrificial layer with lower bandgap at the interface which absorbs IR radiation but which is transmitted by the substrate and the active solar cell layers. Laser ablation is usually done in the UV because most materials absorb in the UV and UV radiation is very intense. However, Ge and GaAs have been ablated with femtosecond pulses at 800 nm and with nanosecond pulses at 1.064 µm separately at an exposed surface. But the buried interface between Ge and GaAs has not been damaged or ablated before.

Figure 7:
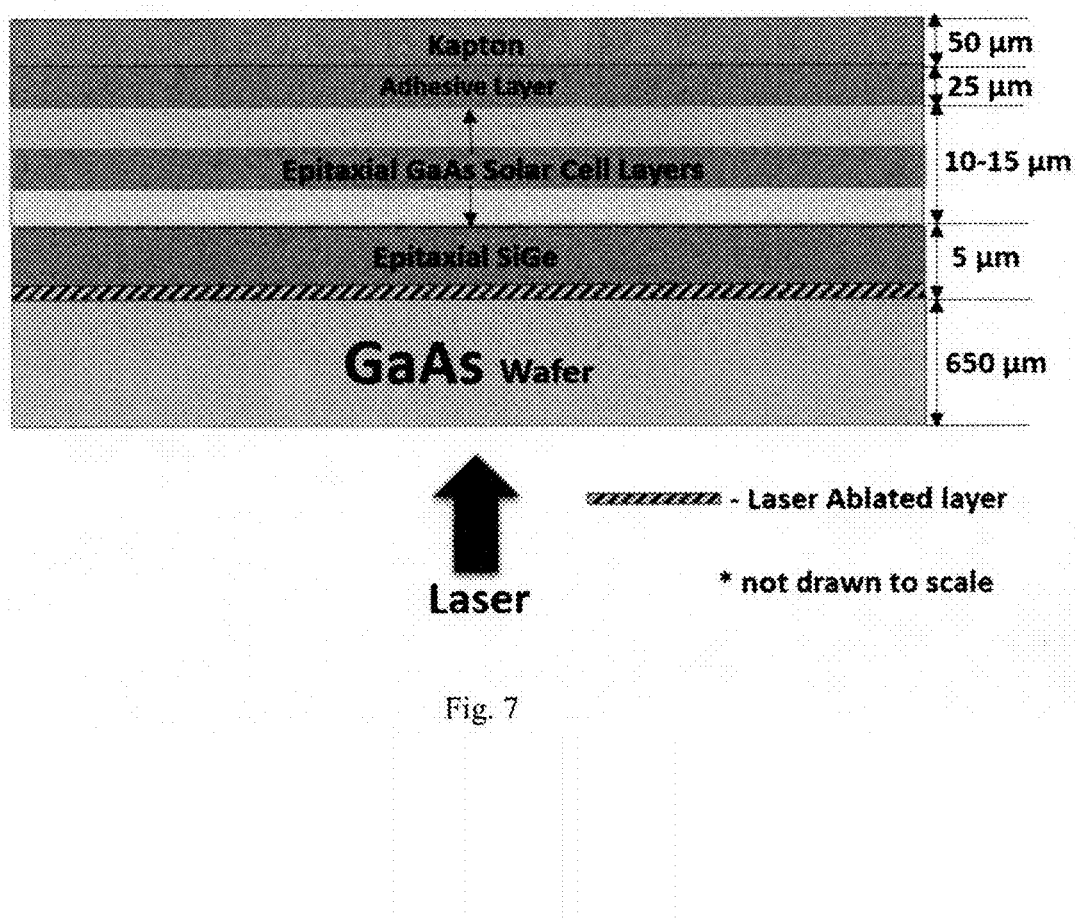
FIG. 7 Solar cell sandwiched between Kapton/adhesive layer on top and SiGe release layer on GaAs wafer.

FIG. 7 shows the solar cell structure sandwiched between the Kapton/adhesive on top and the SiGe/GaAs wafer on the bottom. The SiGe sacrificial release layer, which is predominantly made of germanium (2% Si) and referred to as the Ge layer, can have any thickness. The Ge layer can be 5 µm thick and can be as thick as 20 µm to shield the solar cell from the heat of ablation. Kapton polyimide film is bonded to the epi-layer face down using organic adhesive. The Kapton and adhesive withstand −196° C. for space applications. The laser is incident from the bottom side through the GaAs wafer. The challenge is to absorb in the Ge layer without damaging the GaAs wafer. The incident light can be absorbed in GaAs as long as it does not heat the GaAs wafer above 450° C. A very thin layer about 100 nm of the Ge (crossed blue in FIG. 7) adjacent the Ge/GaAs interface is damaged. After lift-off the remaining Ge is etched away. This step takes only a few minutes because it does not involve lateral etching. Unlike InGaAs, the etchant of Ge does not affect GaAs or the solar cell. Currently, epitaxial lift-off is done by wet lateral etching, which is slow. The chemicals used (HF) are toxic and attack the GaAs wafer and the cell layers. Dry lift-off is much faster and cleaner, which leads to a more efficient industrial process.

Figure 8:
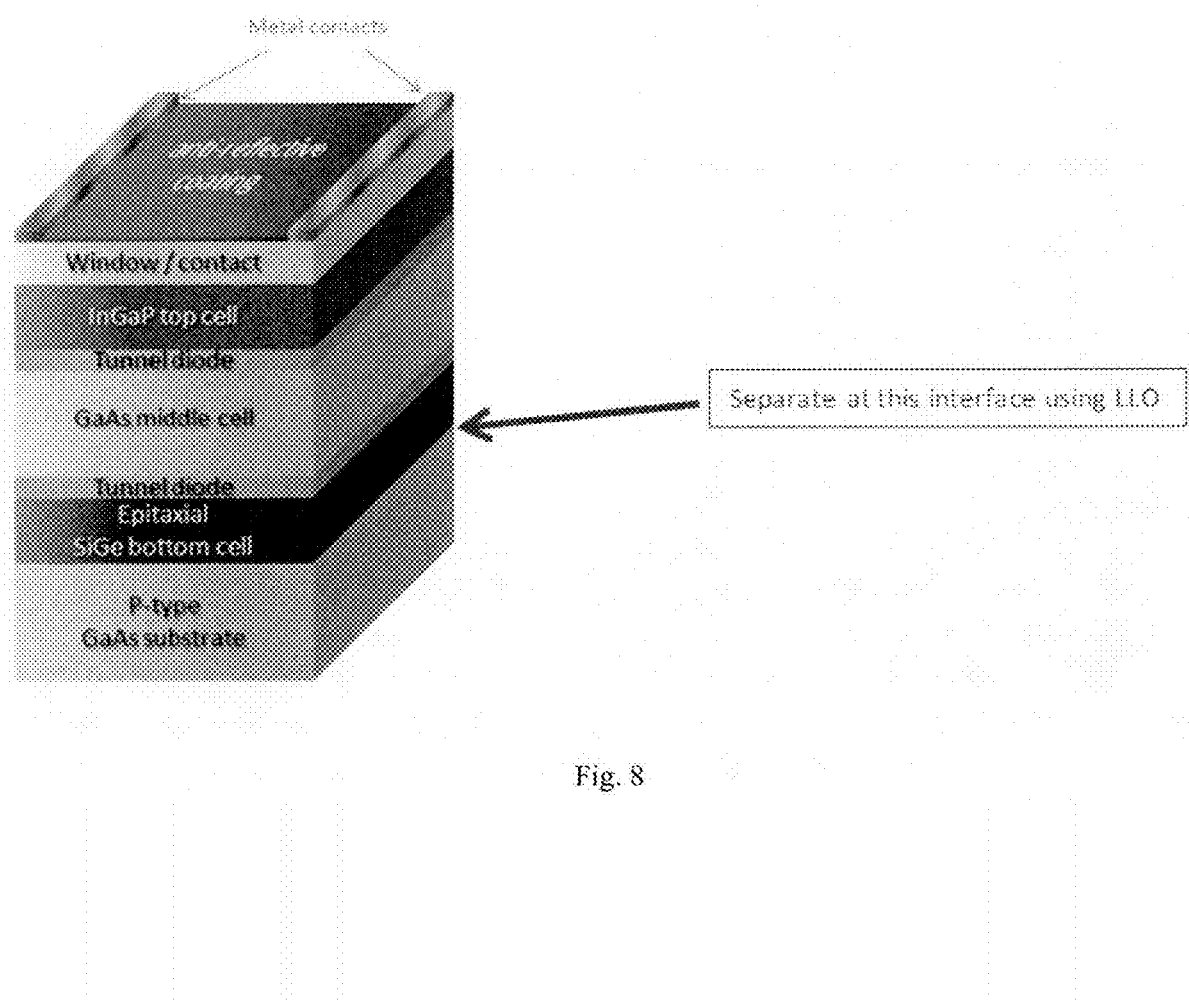
FIG. 8 Non-inverted triple junction solar cell, SiGe bottom cell.
Figure 9:
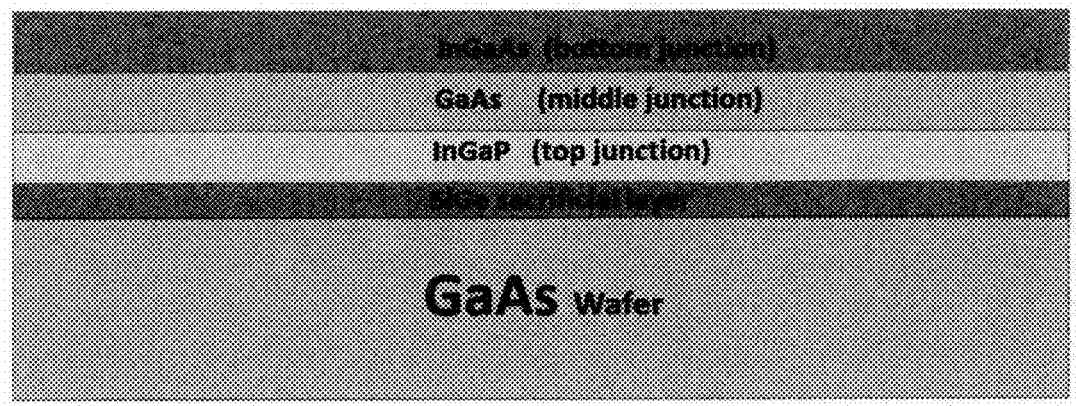
FIG. 9 Inverted metamorphic triple junction (IMM3J) solar cell on SiGe release layer.
Figure 10:
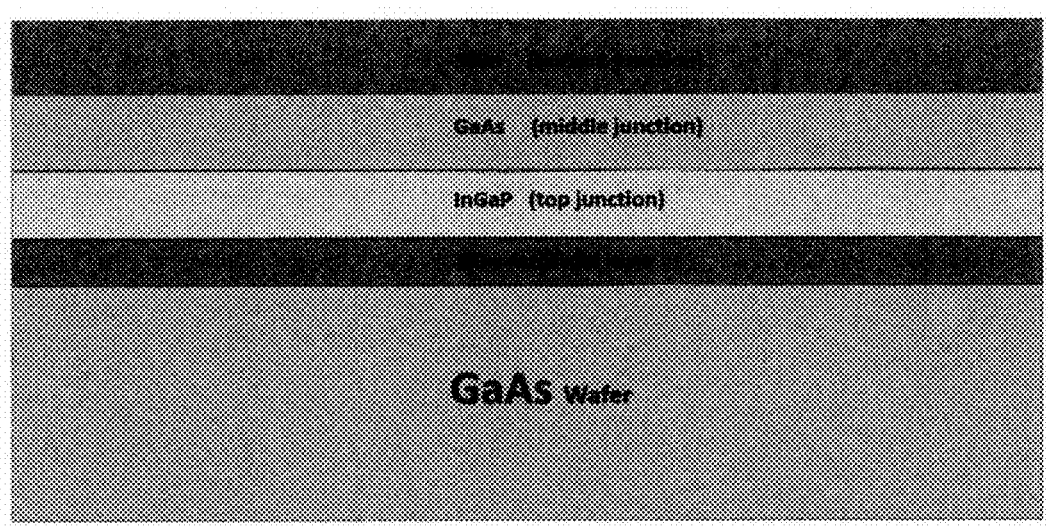
FIG. 10 Inverted lattice matched triple junction (ILM3J) solar cell on SiGe release layer.

A non-inverted triple-junction solar cell structure grown on GaAs substrate, where the SiGe acts as the bottom junction is shown in FIG. 8. The red arrow points to the plane of separation. By contrast, in an inverted IMM3J structure the InGaP top junction is grown first on the SiGe layer and the middle GaAs junction next, i.e. the order of growth of GaAs and InGaP is reversed, as shown in FIG. 9. A metamorphic (lattice mismatched) InGaAs bottom junction is grown last. In an inverted cell the SiGe layer does not play any role in the cell function, other than being a sacrificial layer, which gets ablated away. After separation, the remaining SiGe on the solar cell, which is now on Kapton, is etched away. Alternatively, a second SiGe layer is grown last on the GaAs layer, which provides the bottom junction, as shown in FIG. 10. This yields an inverted lattice-matched (ILM) solar cell.

Figure 11:
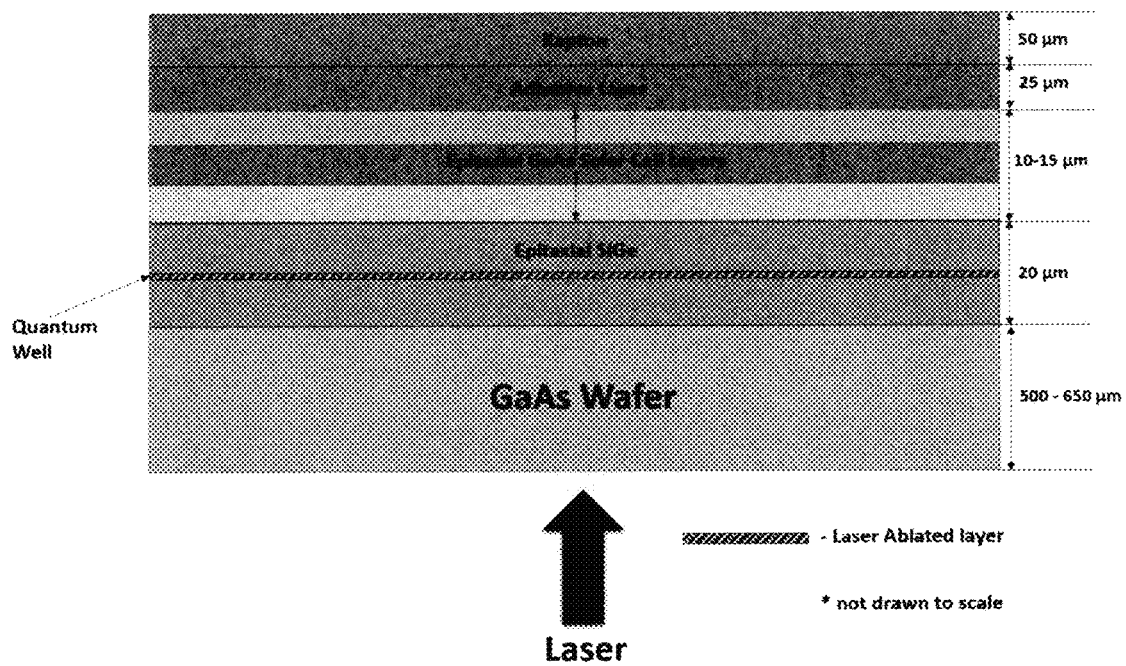
FIG. 11 Solar cell with quantum well absorption layer in SiGe release layer.
Figure 12:
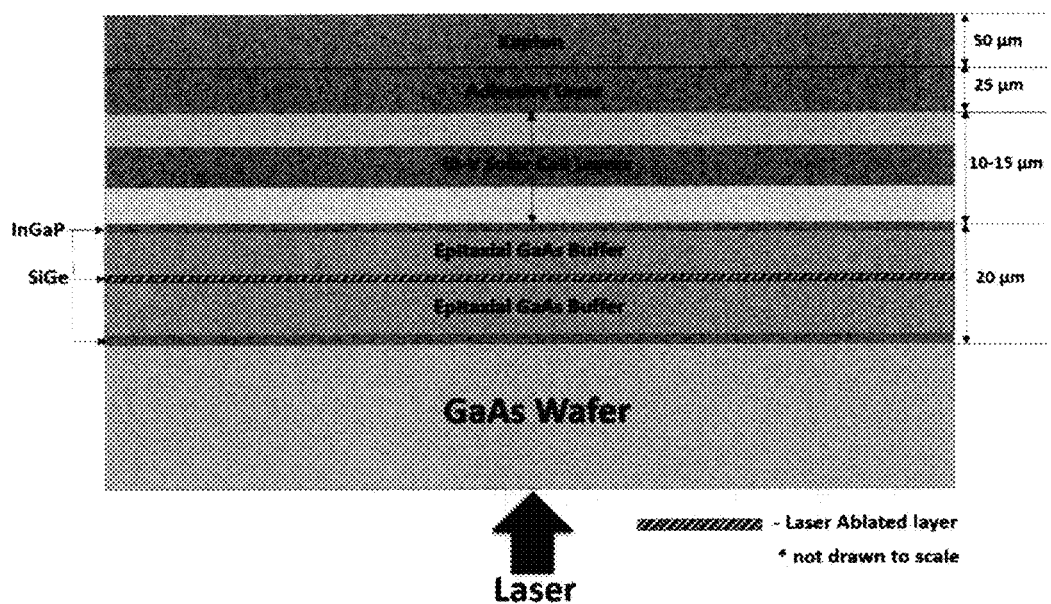
FIG. 12 Solar cell with SiGe release layer sandwiched between GaAs buffer layers and InGaP protection layers.
Figure 13:
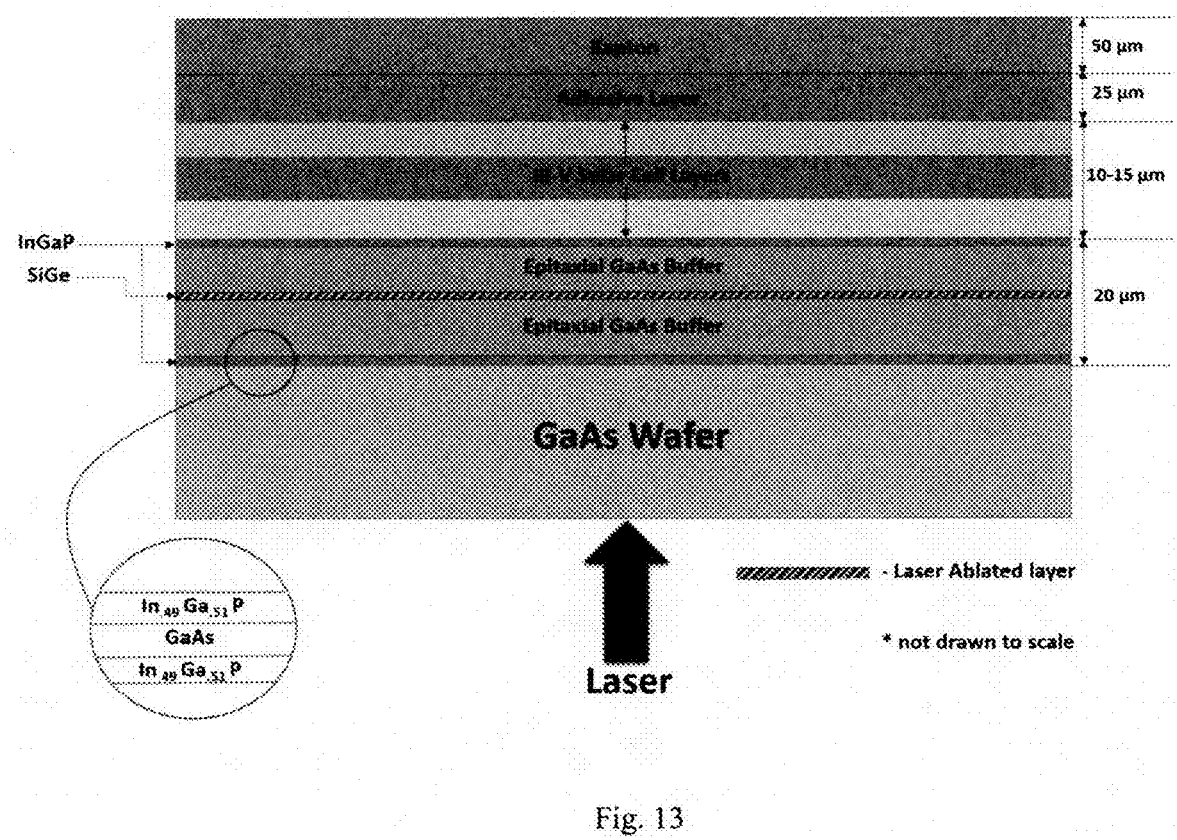
FIG. 13 Solar cell with inset showing details of InGaP protection layers.

It is desired to distance the absorption layer from the interface with the GaAs wafer in order to avoid or lessen the damage to the GaAs substrate. FIG. 11 shows an absorption layer, such as a Quantum Well, having the lowest bandgap in the structure in the middle of the SiGe layer, which is removed for example by about 10 µm from both the GaAs wafer surface and the solar cell. However, Ge being the only known crystalline material with the lowest bandgap that can be grown epitaxially on GaAs, it is expected that the laser absorption would still occur in the immediate vicinity of the GaAs/SiGe interface, potentially causing damage to the GaAs substrate. In a preferred embodiment, the bulk of the sacrificial SiGe layer is replaced with a GaAs buffer layer, which is for example about 20 µm thick and the SiGe absorption layer is confined to the central region, as shown in FIG. 12. The SiGe layer is sandwiched between two thick GaAs buffer layers and InGaP etch stop layers, which serve as cushions to shield the GaAs wafer and the solar cell from damage. A suitable SiGe layer thickness is 1-2 µm which absorbs 1.064 µm radiation efficiently. The incorporation of InGaP protection layers on both sides of the GaAs buffer layer offers the best protection to the GaAs substrate and the solar cell. In a more preferred embodiment, the InGaP protection layers are made of a GaAs layer sandwiched between two $In_{0.49}Ga_{0.51}P$ layers, for example about 0.1 µm thick each, as shown in the inset of FIG. 13.

Figures 2A, 2B:
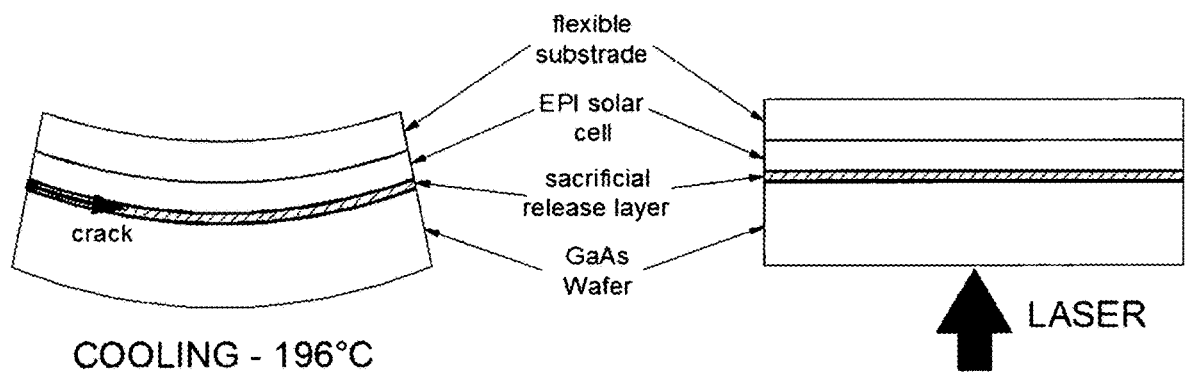
FIG. 2A Concept 1 Crack propagation due to thermal stresses.
FIG. 2B Concept 2 Laser ablation of embedded epitaxial release layer.
Figure 3:
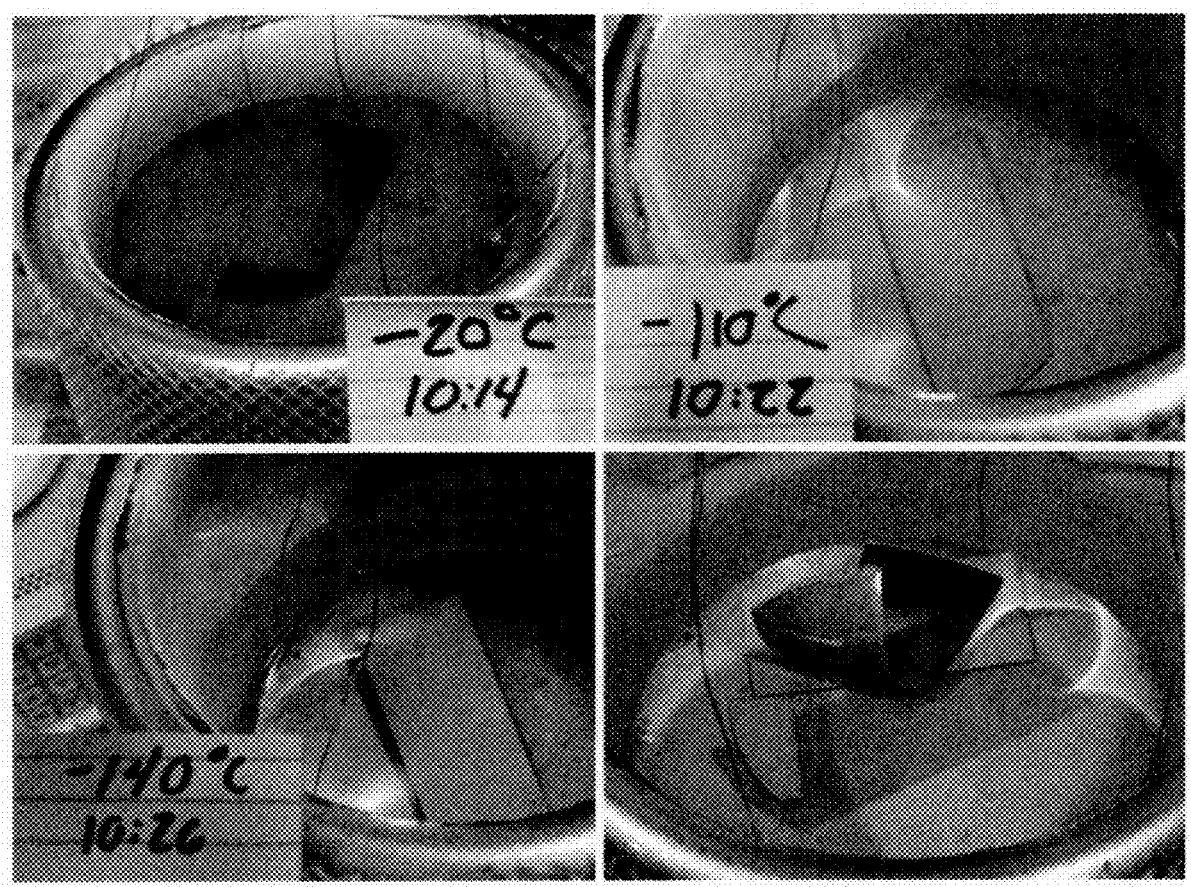
FIG. 3 Epitaxial layer lifted-off GaAs wafer at −140° C. on Kapton sheet (brown) 50 µm thick.
Figure 4:
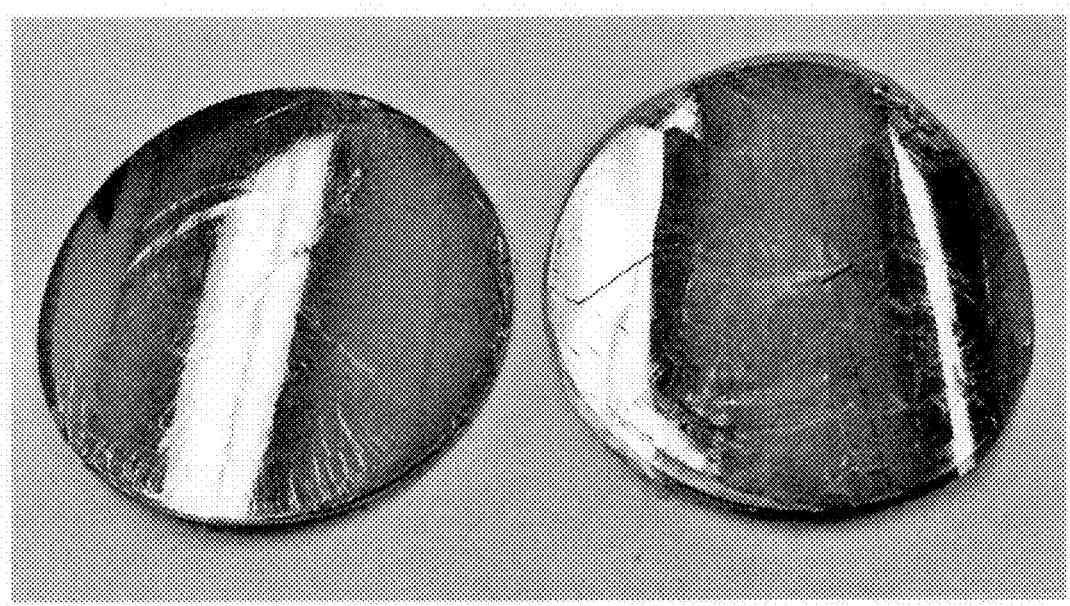
FIG. 4 GaAs (110) wafer lifted on Kapton (right), base wafer (left)
Figure 5:
FIG. 5 GaAs (100) wafer lifted on Kapton (right), base wafer (left)
Figure 6:
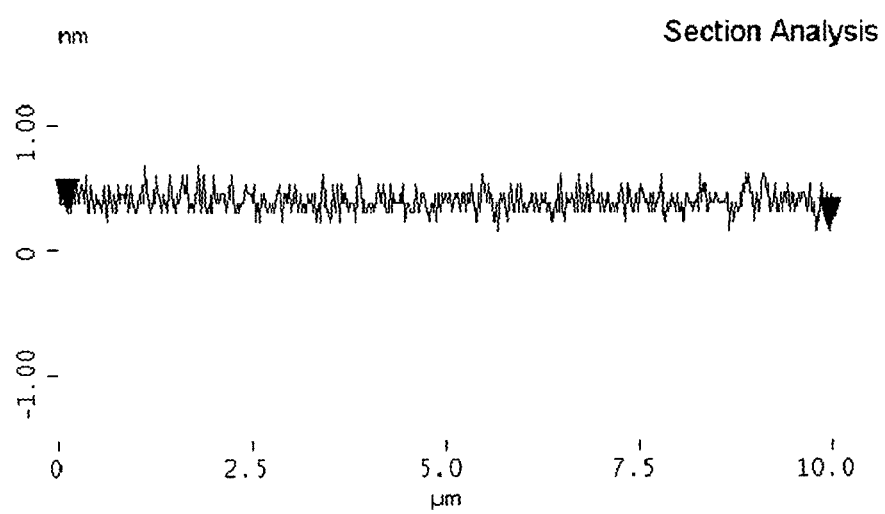
FIG. 6 AFM roughness measurements of GaAs (110) cleaved surface.

The goal is to separate the Kapton from the GaAs substrate by damaging the Ge sacrificial layer with a pulsed laser, as shown schematically in FIG. 2B, without damaging either the wafer or the solar cell. After detachment from the growth substrate, the high efficiency solar cell becomes flexible, free of cracks and permanently attached to the Kapton. It is desired to obtain a clean and smooth surface after separation in order to minimize post lift-off polishing, so that the flexible solar cell can be patterned with metallic lines and the GaAs substrate can be reused preferably multiple times to grow new solar cells.

Epitaxial lift-off can be accomplished by driving a crack near the epi/wafer interface using the thermal stresses due to the difference in CTE's between polyimide and semiconductor, as explained above. However, that does not yield very precise control over the cleavage plane. The innovation in the current approach is the use of laser which allows precise control over the plane of separation by embedding a sacrificial release layer at the root of the epi-layer. Another major advantage of the laser is that it is independent of the crystallographic orientation of the wafer. Crack propagation tends to favor (110) planes in GaAs. By contrast, the laser is able to damage any layer equally regardless of orientation. This yields smooth surfaces for any orientation, particularly (100), at a very precise depth. The entire GaAs industry is based on (100) orientation. Therefore, a solution which is geared toward (100) wafers is desired. This can be accomplished using laser epitaxial lift-off.

Figure 14:
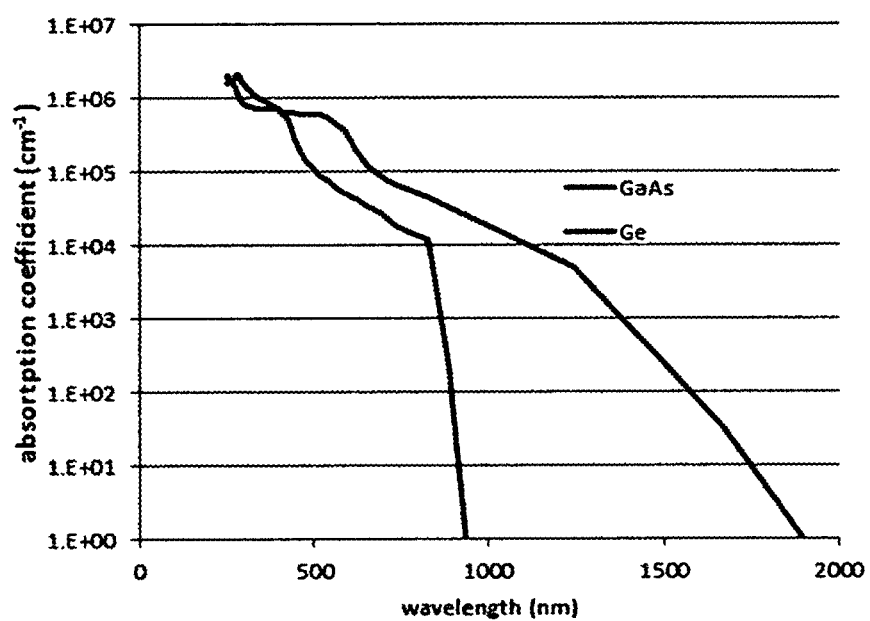
FIG. 14 Single photon absorption coefficients of Ge and GaAs.

The main objective is the ablation of an embedded layer. The problem is that the laser has to cross the GaAs wafer without damaging it. And the absorption should not be the result of precise focusing on the Ge. The focus can be vertically anywhere (even outside the GaAs wafer). It is only the Ge that should absorb, not the GaAs. This is achieved through proper choice of the wavelength, pulse duration and laser power. FIG. 14 shows the absorption spectra of Ge and GaAs up to 2 µm. The absorption in GaAs drops precipitously just before 1 µm. At that wavelength there are four orders of magnitude difference between the absorption coefficients of Ge and GaAs. Thus, it should be possible, in principle, to choose a wavelength just above 1 µm, such as 1.064 µm Nd:YAG, which is a common industrial laser with pulse widths between 5 and 100 nanoseconds to damage the Ge but leave the GaAs unscathed. But it is not so simple because this graph is for single photon absorption. The absorption in Ge and GaAs could actually be due to two or even three photons.

Figure 15:
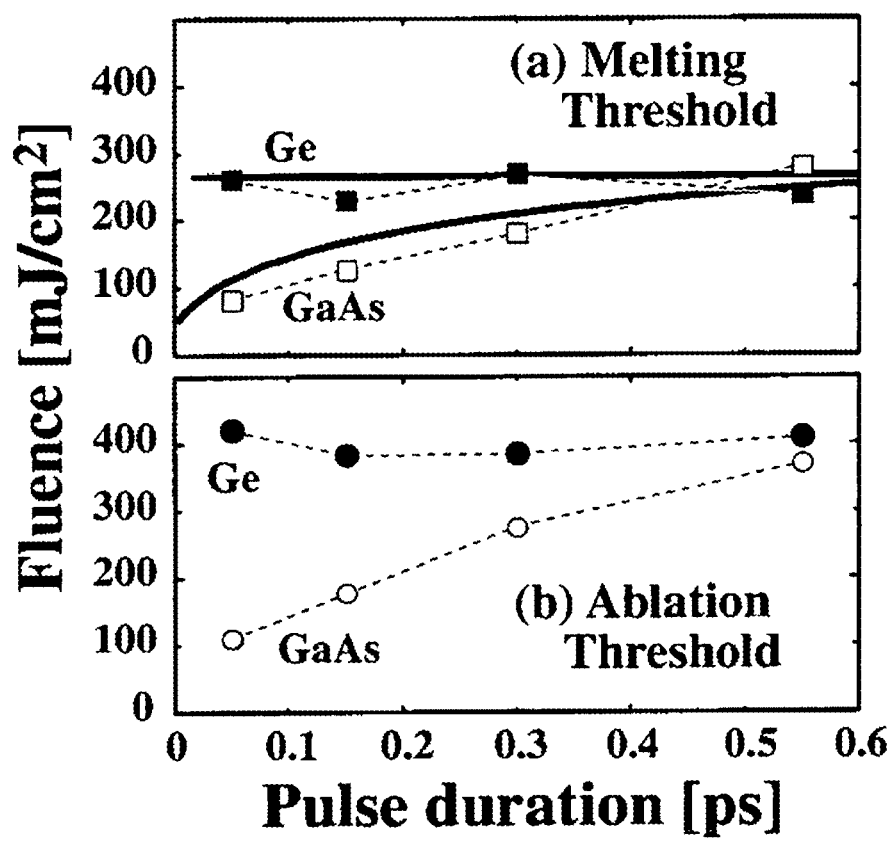
FIG. 15 Single-shot melting and ablation thresholds of Ge and GaAs for femtosecond pulses at 800 nm.

It is desired to spread the laser over the entire 4" wafer, as long as the laser has enough power to do the ablation. The Ge evaporates when ablated and needs room to escape. It would be more advantageous to ablate the entire wafer in one shot, if possible, to provide room for the Ge to escape. Materials melt before evaporating. The melting point of Ge is 937° C. whereas that of GaAs is 1240° C. So it is expected that Ge would melt first. Yet GaAs has a lower threshold for melting and ablation than Ge when illuminated with 100-500 femtosecond pulses at 800 nm, as shown in FIG. 15, which suggests that there are other mechanisms of absorption.

Fluence

An energy density or fluence typically between 100 and 500 $mJ/cm^2$ is needed to damage a semiconductor material corresponding to the threshold of damage. This can be readily obtained from a laser having an energy of about 1 mJ per pulse and a beam diameter of about 1 mm. Such lasers are widely commercially available at low cost. However, it would be advantageous to use more powerful lasers emitting up to a few Joules per pulse, as this would allow spreading the beam over a wider area while still doing the damage, to increase throughput. The laser must cross the GaAs wafer first, typically 500 µm thick, from the backside before it reaches the Ge epi-layer on the front side. For this reason, double side polished GaAs wafers are used to reduce scattering of the light. The GaAs wafer receives about 50% more power than Ge accounting for the Fresnel reflection losses at the Air/GaAs and GaAs/Ge interfaces. The light must not be absorbed in the GaAs. Therefore, it is crucial to find the right laser parameters that will be absorbed in Ge but not in GaAs.

We have demonstrated that we can damage Ge without damaging GaAs. This was accomplished by shining light from a laser on a Ge wafer and a GaAs wafer and raising the power gradually until the onset of damage was observed. This defines the threshold of damage, which must be measured separately for each material using the same laser parameters, i.e. wavelength and pulse width. The measurement was repeated for different wavelength/pulse width combinations until we found a combination for which the threshold of damage in Ge was lower than that in GaAs. This was not easy to accomplish because GaAs tends to absorb heavily over a broad range of wavelengths. However, we have found at least one laser wavelength/pulse width combination which satisfies this requirement.

The threshold of damage cannot be inferred directly from the single-photon absorption coefficient because there could be multi-photon absorption, as mentioned above. Furthermore, there is wide variation among the reported values of the absorption coefficient because it depends on the method of measurement. For this reason, the threshold of damage must be measured experimentally.

Linear Vs Non-Linear Absorption

When the quantum energy of the light is larger than the band gap of the material, single photon is the dominant mode of absorption. When it is lower, then multi-photon absorption is possible under intense illumination. It is possible to damage a material either linearly or non-linearly. It is preferable to damage the material linearly by choosing a wavelength which is absorbed more heavily in Ge than GaAs. However, Ge being an indirect band gap material, requires phonon assistance to conserve momentum, which slows down the absorption process. By contrast, GaAs having a direct bandgap, absorbs readily. Nevertheless, it is possible to bypass the indirect bandgap and absorb two or three photons simultaneously in the direct bandgap of Ge.

Wavelength and Pulse Width

These are the two key parameters that affect absorption. The single photon absorption (1PA) spectra of Ge and GaAs are shown in FIG. 14. The absorption in GaAs drops precipitously just before 1 µm. At 1.064 µm, for example, the absorption coefficient of Ge ($\alpha_{Ge}=1.36\times10^4$ $cm^{-1}$) is about four orders of magnitude stronger than that of GaAs ($\alpha_{GaAs}=1.2$ $cm^{-1}$). Luckily, Nd:YAG lasers, which are widely commercially available emit at this wavelength. Thus, 1064 nm seems to be the ideal wavelength for Ge/GaAs. We want to take advantage of the strong linear absorption in Ge to discriminate against GaAs. However, we cannot be so sure without checking two-photon absorption (2PA). The 2PA cross section of GaAs, $\beta=26$ cm/GW at $\lambda=1.064$ μm. Therefore, an intensity on the order of 50 MW/cm$^2$, which is typical of Nd:YAG lasers, will yield a non-linear absorption coefficient in $\beta I \sim 1.2$ cm$^{-1}$, which is on the same order as 1PA. This ensures that non-linear absorption does not play a major role at 1.064 μm.

If we divide the energy density by the pulse width we obtain the power density, or intensity I. At a fluence of 250 mJ/cm$^2$, for example, and for a typical Nd:YAG laser with a pulse width of 5 ns, I=50 MW/cm$^2$. For shorter pulses the intensity increases to maintain the same fluence, and non-linear absorption becomes more and more important. At some point three-photon absorption (3PA) ($\gamma I^2$) becomes even larger than 2PA ($\beta I$). For this reason there is a minimum pulse width beyond which non-linear absorption becomes unavoidable. For Nd:YAG lasers the minimum pulse width is about 1 ns. With femtosecond lasers, it is only possible to damage the material non-linearly.

Two Photon Absorption in GaAs and InGaAs

FIGS. 16A and 16B show the 2PA cross-sections $\beta$ for GaAs and InGaAs, respectively. The 2PA in GaAs curtails at 1.75 μm. Single photon absorption becomes insignificant above 1 μm, while two-photon absorption in GaAs vanishes above 1.75 μm. Thus, any wavelength above 1.75 μm will transmit through GaAs and can in principle be used. However, it remains to be seen whether Ge would absorb at a wavelength longer than 1.75 μm. Also three-photon absorption in GaAs must be checked to see whether it becomes significant above 1.75 μm. In$_{36}$Ga$_{64}$As is significantly strained and has a band gap of 0.92 eV. The curve does not extend to 1.064 μm, but it can be estimated by extrapolation around 50-60 cm/GW, which is still 4 orders of magnitude below Ge. Therefore, Ge absorbs significantly more than InGaAs. Hence, Ge is more advantageous as a sacrificial release layer than InGaAs.

Three-Photon Absorption in GaAs

Figure 17A:
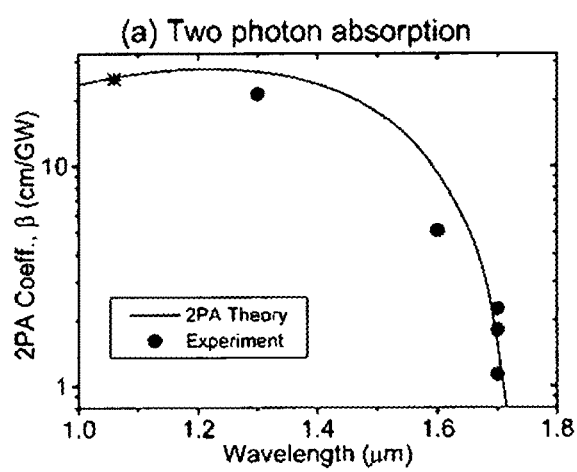
FIG. 17A Two-photon absorption coefficient of GaAs.
Figure 17B:
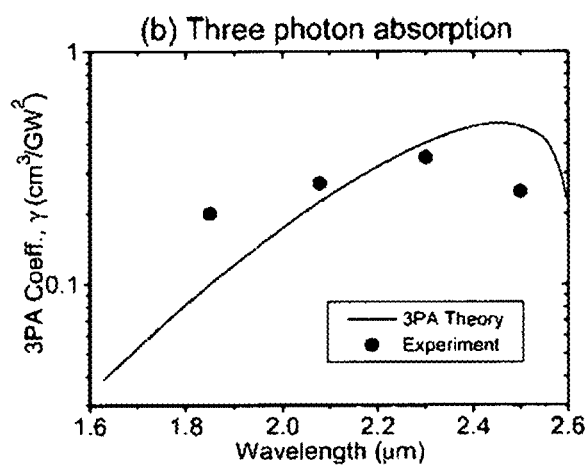
FIG. 17B Three-photon absorption coefficient of GaAs.

Even though 2PA tapers off at 1.75 μm, but 3PA picks up above 1.8 μm, as shown in FIGS. 17A and 17B. The 3PA coefficient $\gamma$ of GaAs ranges between 0.2 and 0.35 cm$^3$/GW$^2$ between 1.8 and 25 μm and can theoretically reach 0.5 cm$^3$/GW$^2$ at 2.5 μm. At 2.6 μm it drops to $\gamma$=0.2 cm$^3$/GW$^2$. For I=7.5×10$^{11}$ W/cm$^2$, which is typical for a femtosecond laser at $\lambda$=2.627 μm, $\gamma I^2$=112,500 cm$^{-1}$, which is extremely high. Comparatively, if this power density were at 1.064 μm then $\beta 1$=19.500 cm$^{-1}$. Thus, 3PA can be significantly higher than 2PA. This explains the surface damage observed in GaAs at $\lambda$=2.627 μm. Therefore, it is of utmost importance to avoid non-linear absorption in GaAs at all wavelengths. The published data for GaAs goes only up to 2.6 μm. Most notably missing is the absorption data between 2.8 and 2.9 μm.

Non-Linear Absorption in Ge

Two-photon absorption in Ge is both direct and indirect. The non-linear direct transition is 75 times stronger than the non-linear indirect transition and reaches a peak value of $\beta$=28 cm/GW at 0.45 eV ($\lambda$=2.75 μm), compared to $\beta$=0.4 cm/GW for the indirect two-photon absorption at 0.49 eV ($\lambda$=2.5 μm), as can be seen from FIGS. 18A and 18B. Ge is an indirect bandgap material for single photon absorption. Not only does the non-linear absorption become stronger than the linear absorption, but also the direct transition becomes stronger than the indirect transition. Thus, under intense illumination the absorption in Ge bypasses the indirect bandgap and absorbs directly. Reported values of $\beta$ can vary widely by several orders of magnitude depending on the source, as shown in FIG. 18C. The majority of the discrepancy is attributed to the exclusion of free carrier absorption.

3PA in Ge becomes even more important than 2PA above 2.8 μm as $\beta$ drops to zero at 0.4 eV ($\lambda$=3.1 μm). Assuming that the direct 3PA $\gamma_{Ge}$ remains ~0.05 cm$^3$/GW$^2$ in the range 2.8-2.9 μm where 2PA is allowed, 3PA will dominate at intensities greater than 300 GW/cm$^2$. The non-linear absorption coefficients in Ge reach values of $\beta I$=45,000 cm$^{-1}$ and $\gamma I^2$=28,125 cm$^{-1}$ over the range 1.6-2.6 μm, compared to $\gamma I^2$=112,500 cm$^{-1}$ for GaAs. Therefore, GaAs absorbs more than Ge in this wavelength range. Thus, it is crucial to suppress the 3PA in GaAs if there is to be any chance of damaging Ge non-linearly while saving GaAs. GaAs has a bandgap of 1.42 eV, and therefore, the 3PA is expected to curtail at 0.47 eV ($\lambda$=2.63 μm). The 2.627 μm wavelength is right at the edge of the 3PA band. However, it is not known whether 4PA picks up beyond that wavelength. These values exceed the linear absorption coefficient of Ge ($\alpha_{Ge}$=1.36× 10$^4$ cm$^{-1}$) at 1.064 μm. This explains the lower threshold of damage encountered at 2.627 μm compared to 1.064 μm. Thus, it would be more advantageous to damage Ge linearly and avoid non-linear absorption in GaAs at all wavelengths.

Femtosecond Lasers

Femtosecond lasers have pulse energies on the order of 10 μJ and pulse widths of 100-500 fs, and must be focused to a spot size on the order of 100 μm in order to garner sufficient energy density (150 mJ/cm$^2$) to do the damage. But the intensity is very high on the order of (Tera) 10$^{12}$ W/cm$^2$. At these power densities non-linear effects become unavoidable. The dependence of the non-linear absorption in GaAs on pulse width is highlighted in FIG. 15 which compares the melting and ablation thresholds of Ge and GaAs at 800 nm in the pulse width range 100-500 fs. The fact that the threshold of GaAs increases, i.e. absorption decreases for longer pulses, whereas that of Ge remains relatively constant is indication of stronger non-linear absorption in GaAs than Ge. Ge is expected to absorb more than GaAs linearly at this wavelength according to the 1PA spectrum in FIG. 14. It turns out that Ge and GaAs absorb fundamentally differently. The ablation depths do not correlate with the optical penetration depths. The absorption depth in GaAs is decreased due to non-linear absorption, and the absorption depth in Ge is increased due to carrier diffusion and redistribution of the absorbed energy deep into the bulk of the solid, with the result that GaAs absorbs more than Ge, hence the lower threshold.

Non-linear absorption in GaAs is not an issue for nanosecond lasers at 1.064 μm, but it is a major issue for femtosecond lasers at 2.8 μm. But the problem is that nanosec lasers tend to melt the material thermally, whereas femtosecond and picosecond pulses yield a smoother cleaner cut. This is especially desirable to obtain a smooth surface.

Thermal Vs Non-Thermal Melting

The photons are absorbed within 100 fs. The electrons transfer the energy of the radiation to the lattice by interaction with phonons in a process of thermalization which lasts up to a few (1-10) picoseconds. The temperature of the atomic lattice starts to rise from the moment the photons hit the surface. However, if the pulse lasts less than 1 ps then the lattice temperature does not have time to reach the melting point. On the other hand, if the radiation lasts longer than a few ps, then the laser heats the solid beyond the melting point.

Incoming photons are absorbed by the free electrons leading to the formation of a gas of hot carriers which transfer their energy to the ions through the emission of phonons. Ions and electrons eventually reach equilibrium on a timescale 10$^{-12}$-10$^{-11}$ s (1-10 picoseconds). This timescale is crucially important as it sets the boundary between strictly thermal and non-thermal regimes, which distinguishes "long" from "short" pulses. A nanosecond is a very long time by electronic scales. For ultra-short pulses ($<10^{-12}$ s), the material is driven into a highly non-equilibrium state. In this case, each pulse acts as if it were alone, independent of the other pulses. By contrast, if the pulse width is much longer than the diffusion time, equilibrium prevails and phase changes can be considered as slow thermal processes involving quasi-equilibrium thermodynamics. In the long pulse regime the material reaches a steady state temperature under the cumulative bombardment of many (tens of thousands) of pulses and the surrounding material is heated beyond the melting point.

In the first few hundred femtoseconds under intense excitation, about 10% or more of the valence electrons are driven into the conduction band. The excitation of such a large number of electrons from bound to orbital states causes repulsive inter-atomic forces which weaken the lattice and break the covalent bonds almost instantaneously. The ultra-short photo-excitation gives the atoms enhanced mobility without increasing their thermal energy. The ions perform large excursions from their initial positions causing permanent structural damage. These non-thermal structural changes are driven purely by the electronic excitation system and occur on a sub-picosecond time scale while the lattice is still relatively cold and far out of equilibrium with the carriers. This structural weakening is often referred to as "non-thermal or ultra-fast melting" or "cold ablation" and can occur at fluences even below the threshold of damage in Ge and GaAs. Non-thermal disordering of Ge and Ge/Si heterostructures and GaAs has been reported for fluences up to 1.5 times the threshold of damage. Thus, it is desired to ablate Ge at a fluence about the threshold of ablation.

Above the threshold, disordering takes tens of picoseconds, consistent with a thermal melting process. The carriers reach thermal equilibrium with the lattice within a few picoseconds. For pulses with duration of a picosecond or longer, the energy of the electrons is transferred to thermal motion of the ions, which can cause melting. However, if the fluence is kept close to the threshold and the pulse is very short then thermal melting can be avoided. All processes are thermal and involve heating of the lattice, except that for ultra-short pulses lasting less than $10^{-12}$ sec, the electrons and the lattice do not have time to reach thermal equilibrium during the excitation. For this reason it is often labeled as a "non-thermal" process. Thermal structural changes, such as melting and ablation happen on a time scale between 10 ps and 10 ns. After the excitation is gone, the temperature returns back to ambient over microseconds due to thermal diffusion. If melting has occurred, then re-solidification ensues on a time scale between 1 ns and 1 µs.

Heat diffusion reduces the working temperature at the focal spot and the efficiency of the micromachining process because it sucks energy away from the work spot, energy that would otherwise be used for removing material. It creates shock waves and micro-cracks in the surrounding material and causes damage to adjacent structures. The heat affected zone (HAZ) is about 30 µm wide. The melted material re-solidifies and deposits and contaminates the surface. The debris is extremely hot and very difficult to remove. It is therefore desirable to reduce or eliminate heat diffusion.

Ultrafast pulses are extremely short and powerful. The laser energy has nowhere to go or more precisely does not have the time to move away. The energy piles up in the absorption zone, whose temperature rises instantly past the melting, boiling and evaporation points. So much energy is deposited in such a short time that the material is forced into a state of plasma. Femtosecond lasers deliver a huge amount of peak power up to a hundred GigaWatt. The power density reaches several TeraWatt/cm$^2$ on the work surface. No material can withstand these power densities. Even air molecules breakdown. There is no melt phase. The energy is absorbed by the electrons much faster than it is transferred to the lattice. Heat diffusion is virtually eliminated. There is no collateral damage, no melt zone, no micro-cracks, no shock waves, no recast layer, and no damage to adjacent structures. The plasma expands away from the surface as a highly energetic plume taking all the heat away with it. Consequently very little heat is left behind to damage the adjacent material. This yields high quality machining, which is very desirable.

Ultra-fast laser pulses have sufficient peak power and generate high enough electric fields to break the molecular bonds of the material, transforming it directly from a solid to a gas. These pulses are so fast that the energy doesn't have a chance to do more than break the material's molecular bonds. This is known as photochemical or photolytic decomposition, which usually happens in the UV. However, it can also happen in the NIR through two-photon absorption. During purely photochemical processing, the temperature of the system remains relatively unchanged. It has been shown that crystalline Ge and GaAs undergo non-thermal ablation in the sub-picosecond time scale. The material is damaged with one pulse.

The energy is initially stored in the electronic system. If the intensity of the laser is high enough to overcome the bonding energy of the outer valence electrons, then the electrons are stripped from the lattice by multi-photon absorption, which leads to avalanche ionization. The ablation depends on the presence of free electrons in the beam path. Semiconductors have plenty of electrons, except that the vast majority of them are bound. Very high energetic radiation, such as UV or ultra-short pulse NIR lasers have enough power to knock some electrons free. The free electrons collide with other bound electrons and create an avalanche. This leaves the atoms near the surface ionized, all positively charged. The excited electrons escape from the bulk material and form a strong electric field that pulls out the ions within the impacted area. The Coulombic repulsion of the positive ions breaks the chemical bonds that previously held the solid together. The ions break apart in a cloud of rapidly expanding plasma. This process is known as Coulomb explosion, which is considered "gentle ablation" because it happens just above the threshold fluence of ablation and leaves behind an atomically smooth surface. The release of fast ions with a narrow velocity distribution indicates a non-thermal process.

A power density of $5 \times 10^{12}$ W/cm$^2$ which is readily attainable with commercial femtosecond lasers, with about 100 fs long pulses, when focused to an area 100 µm×100 µm=$10^{-4}$ cm$^2$, is close to the threshold of laser-induced air breakdown of $10^{13}$ W/cm$^2$ at which plasma is generated. This yields an energy density of 500 mJ/cm$^2$, which is near the threshold of ablation of Ge. Therefore, the power available from commercial lasers yields gentle ablation because it is near the threshold of ablation. At these intensities non-linear absorption becomes dominant and causes multi-photon ionization.

Figure 19:
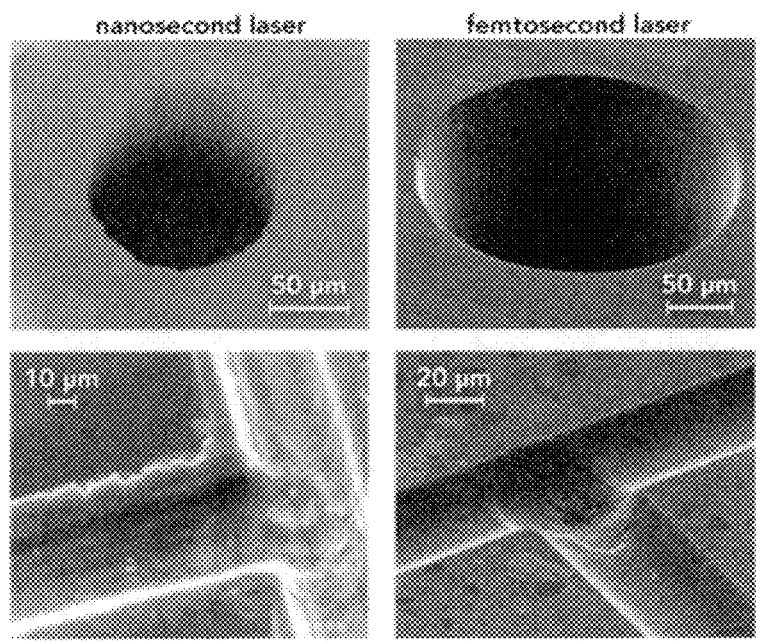
FIG. 19 Nanosecond vs femtosecond laser machining.

Ablation is especially problematic at a buried interface because the melted material re-solidifies and may prevent the two materials from detaching. Furthermore, as the laser spot is scanned on the wafer on a milli-second time scale, the melted material re-solidifies on a micro-second time scale and will re-attach the spot that was just ablated, and may prevent the separation of the epi-layer. FIG. 19 shows examples of microstructures that were micro-machined with nanosecond and femtosecond lasers. The advantages of micromachining with femtosecond laser are unmistakable.

Ablation is the removal of macroscopic amounts of material which are ejected from the surface of a solid when irradiated by a short, intense laser pulse. The onset of damage occurs when the fluence reaches a certain threshold. At the threshold, atomic bonds are broken in a certain plane and the atoms on both sides of that plane remain where they are. This is the ideal damage that we would like to accomplish with an electron plasma (Coulomb Explosion). We want to avoid excessive heating and melting and ablation (ion plasma or Phase Explosion) and the removal of material and shock waves at the buried interface, because the debris has nowhere to go and could damage the GaAs wafer and the solar cell or LED.

Figure 20:
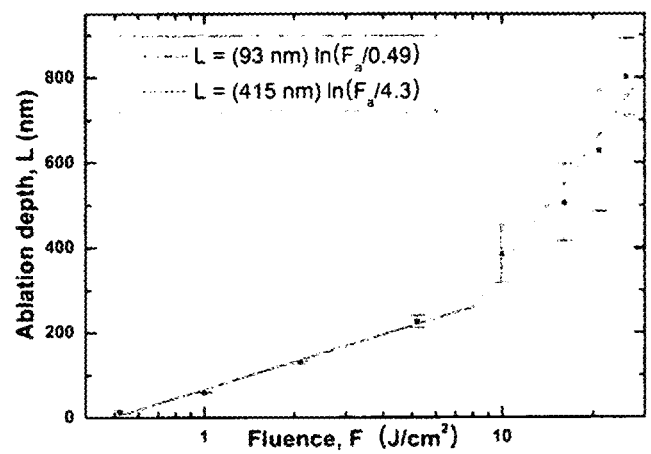
FIG. 20 Single-shot ablation depth of Ge using 150 fs pulses at 800 nm as a function of fluence.

FIG. 20 shows the single-shot ablation depth of Ge for ultrashort 150 femtosecond laser pulses at 800 nm as a function of fluence above the threshold of about 300 mJ/cm$^2$. There are two distinct regimes: the low fluence regime which is characterized by the optical penetration depth, and the high fluence regime which is characterized by the electronic heating depth. At lower fluences the changes in structure and surface morphology are minimized by heat diffusion because the electron heating depth is negligible. Ge has been reported to melt rapidly and homogeneously in a non-thermal process using ultrashort laser pulses. At higher fluences electron heat diffusion plays a major role. Ge can be damaged without structural modification near the threshold by avoiding electron heat diffusion.

The threshold of damage in GaAs at 1.064 μm drops with the number of pulses from 1.5 J/cm$^2$ for N=1 to 0.5 J/cm$^2$ for N=10. Lattice defects near the surface of the GaAs wafer are possible absorption sites for nucleating damage, which lead to the accumulation of damage due to multiple pulses. For this reason, it is preferable to use a single pulse in order to control the depth of cleavage. Multiple pulses could reach higher depths. It would be advantageous to spread the beam, i.e. use more powerful lasers, as long as the beam profile is homogeneous. Ideally if the beam covers the whole wafer then the damage can be done in one shot using a single pulse which would eliminate the necessity to scan the laser beam across the wafer. The pulse repetition rate of the laser is not important.

Laser Power Vs Cost and Throughput

Unlike nanosecond lasers which are available in a wide range of pulse energies and widths from milli-Joules to Joules and from a few nanoseconds to hundreds of nanoseconds, femtosecond lasers offer only up to a few tens of micro-Joules per pulse at most at 2.8 μm and a limited range of tunability in pulse width, and cannot be spread over a wide area. They must be focused to a spot size about 100 μm to garner sufficient energy density to do the damage. Typical femtosecond lasers that can be tuned in this wavelength range cost about $500 k including the optical power amplifier (OPA). As can be seen from FIG. 15, the threshold of damage of GaAs can be made to equal and exceed that of Ge for pulses longer than 500 fs. However, a margin of at least 3 is needed to protect the GaAs wafer from damage even with a uniform beam. By contrast the most powerful Nd:YAG Quanta-Ray Pro 350 laser from Spectra Physics with a pulse width of 10 ns and energy of 2.5 J per pulse can be spatially filtered and expanded to cover an area of 20 cm$^2$ equivalent to a 2" wafer and still yield a fluence of 300 mJ/cm$^2$ to damage Ge and costs about $115 k. A low power 1 mJ Nd:YAG laser can produce the same damage over a spot size of 1 mm but costs only $30 k. The motivation to use a Nd:YAG nanosec laser is that it is cheaper.

A smaller and cheaper Nd:YAG laser that is raster scanned across the wafer can do the job. The damage is still done with a single pulse per spot. Therefore the pulse repetition rate of the laser must be synchronized with the speed of the servo galvanometer. For nanosec laser the spot has a diameter of 1 mm and moves on the surface of the wafer at a speed of a few meters/sec. Therefore, it takes only a few seconds to roster scan an entire 4" wafer. For a femtosecond laser it may take hundreds of seconds. A high power laser yields a higher throughput especially if it can be expanded to cover the entire piece or wafer in one shot. A cost vs throughput analysis can be done for low power scanned vs high power expanded systems to compare the cost of the laser with the cost of the scanning optics and servo control equipment.

Methodology of Experiment

We have done the following experiments: Using two different lasers, one Nd:YAG emitting at 1.064 μm, and the other Ti:Sapphire with OPA tuned to 2.627 μm, we shone the light on a Ge wafer and a GaAs wafer separately, in each case raising the intensity gradually until the onset of damage was observed visually. The GaAs wafer was undoped. The thresholds of both materials were measured experimentally at each wavelength using different pulse widths. In each case a single pulse or a few pulses were used to damage the material. The onset of damage to the Ge wafer determines the threshold of energy density for that particular wavelength/pulse width combination. The lasers had the following specs:

Nd:YAG: Pulse width 5-6 nanoseconds, max energy per pulse 1 J, wavelength 1.064 μm, Q-switched. Highest repetition rate 10 Hz. The laser spot was about 690 μm half width at 1/e$^2$ of maximum irradiance.

Ti:Sapphire: Pulse width 200 fs, max energy per pulse 10.4 μJ, wavelength 2.627 μm, repetition rate 1 KHz. The laser spot was about 65 μm half width at 1/e$^2$ of maximum irradiance.

A synchronized shutter was used with each laser to select the number of pulses. The onset of damage was detected visually by scattering of visible light at 632 nm. A HeNe laser was superposed on the 1.064 μm laser path using a beam combiner and shone simultaneously on the damaged area. At the onset of damage the scattering was immediately visible. The laser-induced damage threshold (LIDT) measurement was done according to the ISO 11254-1 standard, which governs single shot laser-induced damage testing. Ten sites were investigated for damage for each fluence level, with the site spacing being at least two to three times the beam diameter.

Results

Example 1: Nano-Second Laser at 1.064 μm

Figures 21A, 21B:
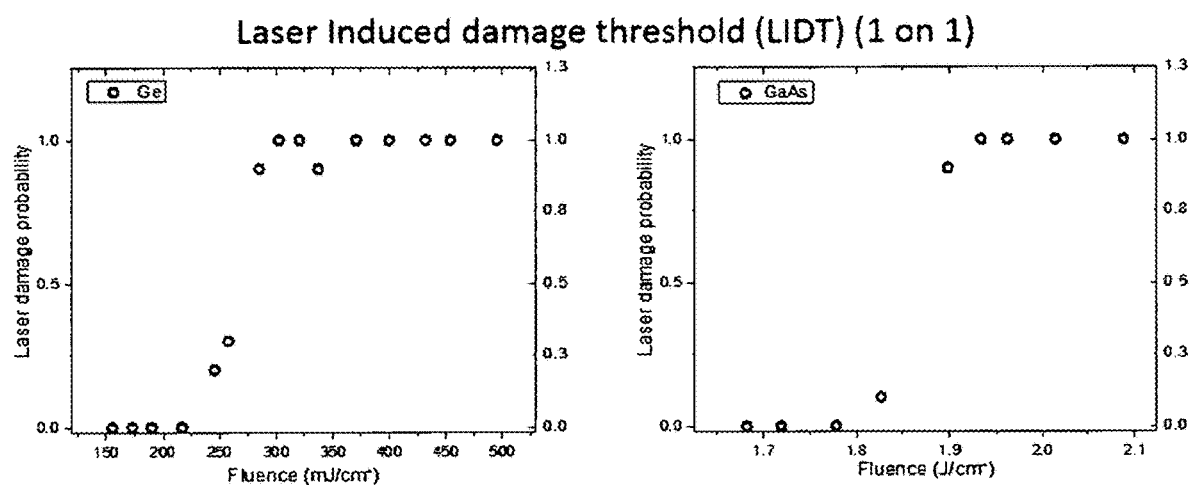
FIG. 21A Laser damage probabilities for Ge obtained with Nd:YAG 5 nsec pulse laser.
FIG. 21B Laser damage probabilities for GaAs obtained with Nd:YAG 5 nsec pulse laser.

The threshold of damage in Ge was observed at pulse energy of 2.4 mJ corresponding to an energy density of 300 mJ/cm$^2$. The threshold of damage in GaAs was observed at pulse energy of 19.2 mJ corresponding to an energy density of 1.9 J/cm$^2$. The data is shown in FIG. 21A for Ge and 21B for GaAs. The ratio of the thresholds of GaAs/Ge is 6.33. Thus, Ge can be damaged with a margin of safety of 6.33 relative to GaAs. At this pulse energy (2.4 mJ), the damage in Ge was not visible after 10 pulses and was barely perceptible after 15 pulses. At this energy level, no damage could be seen in GaAs even after 6000 pulses.

Example 2: Femtosecond Laser at 2.627 µm

Figure 22A:
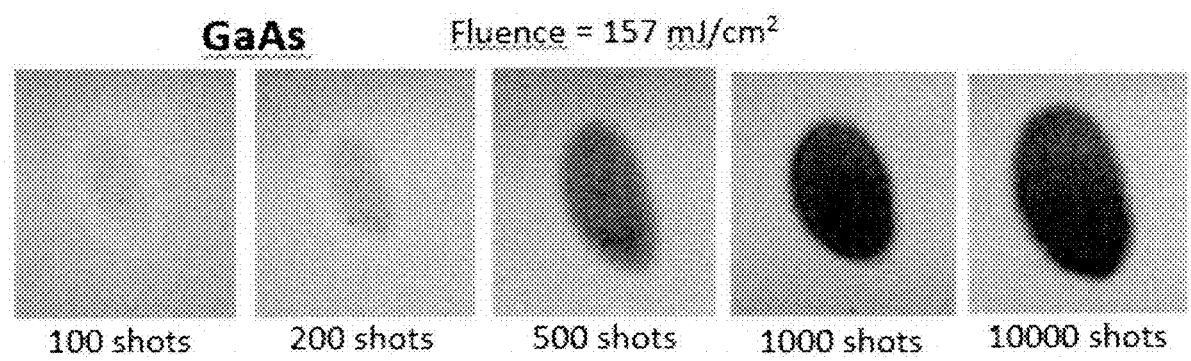
FIG. 22A Damage to GaAs with femtosecond laser at fluence of 157 mJ/cm$^2$.
Figure 22B:
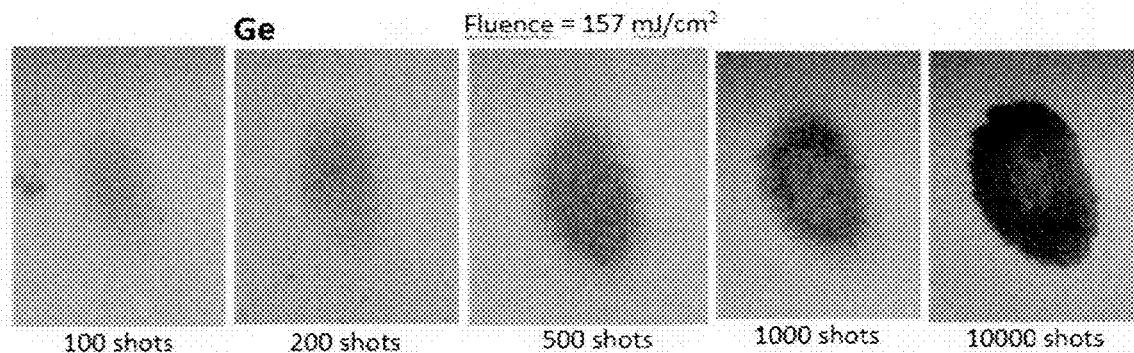
FIG. 22B Damage to Ge with femtosecond laser at fluence of 157 mJ/cm$^2$.
Figure 23A:
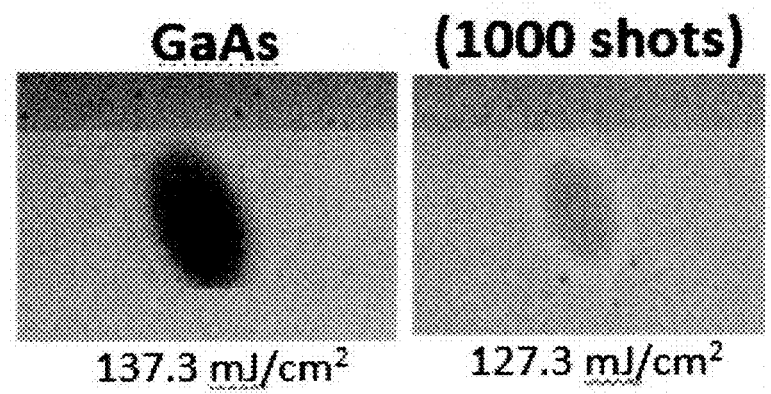
FIG. 23A Damage to GaAs with femtosecond laser at fluences of 137 mJ/cm$^2$ and 127 mJ/cm$^2$.
Figure 23B:
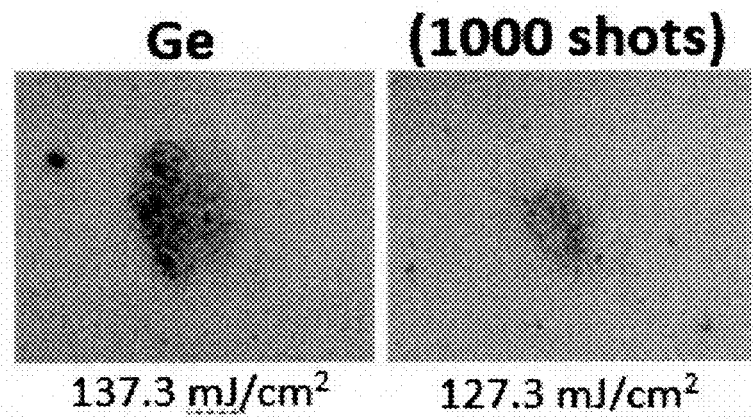
FIG. 23B Damage to Ge with femtosecond laser at fluences of 137 mJ/cm$^2$ and 127 mJ/cm$^2$.

FIG. 22A shows the damage in GaAs obtained with femtosecond laser at a fluence of 157 mJ/cm$^2$ between 100 and 10000 pulses. FIG. 22B shows the same for Ge wafer. Under the same fluence and number of pulses GaAs damaged even more than Ge. The GaAs spot looks even darker than Ge after 500 shots. Even when the fluence was lowered to 137 mJ/cm$^2$ and 127 mJ/cm$^2$ GaAs remained darker than Ge after 1000 shots, as shown in FIGS. 23A and 23B. However, no damage was perceptible in either material below 120 mJ/cm$^2$. The threshold of GaAs is lower than Ge at this wavelength and pulse width. This is due to the fact that 3PA for GaAs $\gamma I^2 = 112,500$ cm$^{-1}$ while $\gamma I^2 = 28,125$ cm for Ge.

CONCLUSIONS

A Nd:YAG laser having a pulse width of 5 ns and energy of 2.4 mJ at 1.064 µm will damage Ge but not GaAs with an advantage of 6.33. No one has done this before. Since the threshold of GaAs is more than 50% higher than that of Ge then we should be able to damage Ge after passing through GaAs wafer, accounting for the Fresnel losses due to reflections at the Air/GaAs/Ge interfaces, with a residual margin of 4. This margin of safety is sufficient to compensate for any inhomogeneity in the laser beam profile. It is preferable to use a uniform laser beam with a flat top. However, the margin of 4 allows for up to 75% variation in the intensity across the laser beam cross-section. Most lasers fit within this range.

The situation at 2.627 µm is not as rosy with GaAs absorbing more than Ge. This is due to the fact that this particular wavelength is right at the edge of the 3PA absorption band in GaAs. Above 2.8 µm 4PA may start playing a role. Micromachining with femtosecond lasers has its advantages, but the problem is that GaAs absorbs heavily non-linearly. It is crucial to suppress non-linear absorption in GaAs at all wavelengths. For this reason it is preferred to damage Ge linearly using a Nd:YAG laser emitting at 1.064 µm.

Heat Simulation

Figure 24A:
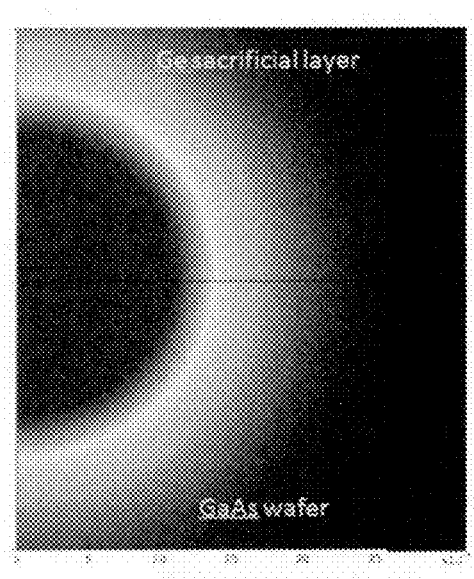
FIG. 24A Temperature profile for 38 nanosec pulse.
Figure 24B:
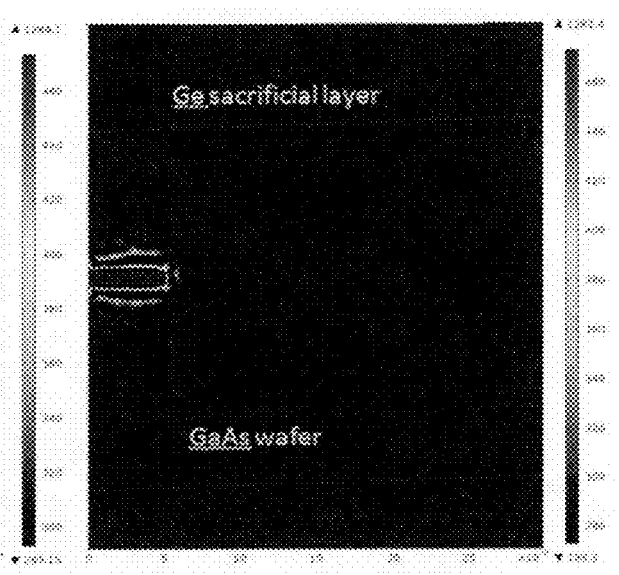
FIG. 24B Temperature profile for 38 femtosec pulse.

FIGS. 24A and 24B show a simulation of the temperature profile at the Ge/GaAs interface for two pulse widths of 38 ns and 38 fs, respectively, using COMSOL. The rectangle at the center left of FIG. 24B represents the absorption zone for femtosecond and has dimensions of 500 nm×100 nm. The color coded scale to the right shows the temperature from ambient 293K (blue) to 473K=200° C. (red). For nanosec pulses, FIG. 24A, about 1 µm radius inside the GaAs wafer is above 200° C., in fact the temperature reaches above 900° C. close to the melting point of Ge (937° C.), whereas for femtosecond pulses, FIG. 24B, the temperature across most of the wafer remains cool (blue) well below 200° C. The heat is confined to the 100 nm absorption zone.

Detachment of the Epi-Layer from the GaAs Substrate

Polyimide film, such as Kapton® is advantageous carrier of the thin lifted-off epi layer solar cell because it is backed by DuPont and qualified for space, especially that Kapton is available in sheets as thin as 50 µm which can be rolled and stowed very compactly and unfolded in space to provide power for the satellite and space vehicles. Kapton can also be used as the stressor layer to drive a crack using the difference in CTE between polyimide and GaAs in liquid nitrogen.

The separation of the epi-layer from the growth GaAs substrate at a precise plane can be done effectively by damaging an embedded Ge sacrificial release layer with a Nd:YAG laser, as described in the instant invention. However, the Kapton can assist with the detachment of the thin epi-layer from the substrate besides serving as the permanent carrier. Separation of the epi-layer can be carried out solely with the use of the laser, however, that would require damaging the Ge layer contiguously across the entire wafer. Further, even if the separation could be effected completely with the laser, the fragile 4" diameter, 10 µm thick epi-layer cannot be free-standing in air, it needs a support, hence the Kapton. The Kapton could reduce the requirement on the laser damage. Alternatively, the Ge layer can be damaged only at select points across the wafer using the laser and the GaAs/Kapton composite structure subsequently dunked in LN$_2$, so the Kapton can finish the job by propagating a crack in the plane connecting the dots damaged by the laser and separating the layer in a fraction of a second. This could save significant time. Otherwise, the laser would have to dwell and fire at adjacent or overlapping spots to cover the entire 4" wafer surface contiguously. The use of Kapton can reduce the number of shots and the time to raster scan the laser across the wafer significantly. Thus, the most efficient way of detaching the epi-layer from the GaAs wafer could be a combination of both approaches.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed:

1. A method for separating an epitaxially grown layer from a GaAs growth substrate comprising:
    growing an epitaxial sacrificial layer between said epitaxially grown layer and said GaAs substrate having substantially the same lattice constant,
    irradiating said substrate, epitaxially grown layer and sacrificial layer with electromagnetic radiation emanating from a pulsed Nd:YAG laser emitting in the NIR at a wavelength of about 1.064 m, having a pulse width about 5 nanoseconds and energy about 2.4 milli-Joules per pulse and energy density about 300 mJ/cm$^2$, wherein said electromagnetic radiation is predominantly absorbed in said sacrificial layer,
    breaking atomic bonds in said sacrificial layer with said electromagnetic radiation, thereby separating said epitaxially grown layer from said GaAs growth substrate.

2. A method for separating an epitaxially grown layer from a GaAs growth substrate consisting of:
    laminating a layer of polyimide tape comprising a layer of acrylic adhesive having a higher coefficient of thermal expansion than said substrate and said epitaxial layer, to said epitaxial layer,
    selecting a predetermined a thickness of said layer of polyimide tape,
    cooling the laminate in liquid nitrogen, thereby driving a crack in said substrate by thermal stresses due to the difference between the coefficients of thermal expansion of said substrate and said polyimide tape, thus separating said epitaxially grown layer from said growth substrate.

3. The method of claim 2 wherein said polyimide tape is a stressor layer.

4. The method of claim 2 wherein said polyimide tape is a permanent carrier of said epitaxially grown layer after separation.

5. The method of claim 2 wherein said epitaxially grown layer contains a light emitting diode (LED) or an inverted multi junction solar cell.

6. The method of claim 5 wherein said light emitting diode (LED) or inverted multi-junction solar cell is transferred from said GaAs growth substrate to said polyimide tape.

7. The method of claim 2 wherein the thickness of said polyimide tape is about 50 m.

8. A method of thinning a SiC or GaN substrate by separating a first layer from said substrate consisting of:
laminating a second layer of polyimide tape comprising a layer of acrylic adhesive having a higher coefficient of thermal expansion than said substrate, to said first layer,
selecting a predetermined a thickness of said second layer of polyimide tape,
cooling the laminate in liquid nitrogen, thereby driving a crack in said substrate by thermal stresses due to the difference between the coefficients of thermal expansion of said substrate and said polyimide tape, thus separating said first layer from said substrate.

9. The method of claim 8 wherein said laminate comprises multiple layers of polyimide sheet and acrylic adhesive.

10. The method of claim 8 wherein said first layer comprises an epitaxially grown layer.

11. The method of claim 1 further comprising the step of:
laminating a layer of polyimide tape comprising a layer of acrylic adhesive having a higher coefficient of thermal expansion than said epitaxially grown layer and said GaAs substrate, to said epitaxial layer,
cooling the laminate in liquid nitrogen, wherein said polyimide tape assists the separation of said epitaxially grown layer from said growth substrate.

12. The method of claim 11 wherein said electromagnetic radiation breaks fewer atomic bonds in said sacrificial layer.

* * * * *